(12) United States Patent
Puetz et al.

(10) Patent No.: US 8,362,460 B2
(45) Date of Patent: Jan. 29, 2013

(54) METHOD OF FABRICATING SEMICONDUCTOR DEVICES ON A GROUP IV SUBSTRATE WITH CONTROLLED INTERFACE PROPERTIES AND DIFFUSION TAILS

(75) Inventors: Norbert Puetz, Ottawa (CA); Simon Fafard, Ottawa (CA); Bruno J. Riel, Ottawa (CA)

(73) Assignee: Cyrium Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 13/362,444

(22) Filed: Jan. 31, 2012

(65) Prior Publication Data

US 2012/0125418 A1 May 24, 2012

Related U.S. Application Data

(63) Continuation-in-part of application No. 12/959,960, filed on Dec. 3, 2010, now Pat. No. 8,124,958, which is a continuation of application No. 11/776,163, filed on Jul. 11, 2007, now Pat. No. 7,872,252.

(60) Provisional application No. 60/822,138, filed on Aug. 11, 2006.

(51) Int. Cl.
*H01L 29/06* (2006.01)

(52) U.S. Cl. ............ 257/13; 257/94; 257/184; 257/431; 257/464; 257/E21.119; 257/E31.005; 257/E33.014

(58) Field of Classification Search ............... 257/13, 257/94, 184, 431, 461, 464
See application file for complete search history.

(56) References Cited

U.S. PATENT DOCUMENTS

| 4,910,167 | A | | 3/1990 | Lee |
| 4,963,949 | A | | 10/1990 | Wanlass et al. |
| 5,130,269 | A | * | 7/1992 | Kitahara et al. ............... 117/89 |
| 5,484,664 | A | | 1/1996 | Kitahara |
| 6,188,090 | B1 | | 2/2001 | Miyagaki et al. |
| 6,340,788 | B1 | | 1/2002 | King |
| 6,380,601 | B1 | | 4/2002 | Ermer |

(Continued)

FOREIGN PATENT DOCUMENTS

| EP | 0450228 A2 | 10/1991 |
| JP | 2000-58920 A | 2/2000 |

(Continued)

OTHER PUBLICATIONS

Wan et al., ("Characterization of GaAs grown by molecular beam epitaxy on vicinal Ge(100) substrates") American Vacuum Society, pp. 1893-1898, Jul./Aug. 2004.*

(Continued)

*Primary Examiner* — A. Sefer
(74) *Attorney, Agent, or Firm* — Louis B. Allard; Borden Ladner Gervais LLP

(57) ABSTRACT

A multi junction solar cell having epitaxially-deposited III/V compounds on vicinal group IV substrates and method for making same. The solar cell includes an AlAs nucleating layer on a Ge substrate. The group IV substrate contains a p-n junction whose change of characteristics during epitaxial growth of As-containing layers is minimized by the AlAs nucleating layer. The AlAs nucleating layer provides improved morphology of the solar cell and a means to control the position of a p-n junction near the surface of the group IV substrate through diffusion of As and/or P and near the bottom of the III/V structure through minimized diffusion of the group IV element.

19 Claims, 27 Drawing Sheets

U.S. PATENT DOCUMENTS

| | | |
|---|---|---|
| 6,813,296 B2 | 11/2004 | Goyal |
| 6,849,882 B2 | 2/2005 | Chavarkar |
| 6,900,067 B2 | 5/2005 | Kobayashi |
| 6,996,150 B1 | 2/2006 | Shakuda |
| 7,001,791 B2 | 2/2006 | Kryliouk |
| 7,038,284 B2 | 5/2006 | Haukka |
| 2002/0040727 A1 | 4/2002 | Stan |
| 2002/0059898 A1 | 5/2002 | Landini |
| 2002/0069816 A1* | 6/2002 | Gehrke et al. ............. 117/84 |
| 2002/0119680 A1 | 8/2002 | Wang |
| 2002/0167023 A1 | 11/2002 | Chavarkar |
| 2004/0045598 A1 | 3/2004 | Narayanan |
| 2004/0079408 A1 | 4/2004 | Fetzer |
| 2005/0155641 A1 | 7/2005 | Fafard |
| 2007/0238281 A1* | 10/2007 | Hudait et al. ............. 438/604 |
| 2008/0113186 A1* | 5/2008 | Kouvetakis et al. ........ 428/336 |
| 2008/0206966 A1 | 8/2008 | Huffaker |
| 2009/0057648 A1* | 3/2009 | Hudait et al. ............. 257/14 |

FOREIGN PATENT DOCUMENTS

| | | |
|---|---|---|
| JP | 2004-320033 A | 11/2004 |
| WO | 2000059045 | 10/2000 |

OTHER PUBLICATIONS

Fitzgerald et al., "Necessity of Ga prelayers in GaAs/Ge growth using gas-source molecular beam epitaxy", Appl. Phys, Lett., vol. 64 (6), Feb. 7, 1994, pp. 733-735.

European Patent Application No. 07763924.3 Office Action dated May 3, 2010.

Kawai et al., "Ge segregation and its suppression in GaAs epilayers grown on Ge(111) substrate", Applied Physics Letters, vol. 61, No. 10, Sep. 7, 1992, pp. 1216-1218, XP002540613.

Takamoto et al., "InGaP/GaAs-based Multijunction Solar Cells", Progress in Photovoltaics: Research and Applications, vol. 13, No. 6, Sep. 1, 2005, pp. 495-511, XP002540614.

European Patent Application No. 07763924.3, Search Report dated Sep. 16, 2009.

U.S. Appl. No. 11/776,163, Notice of Allowance dated Sep. 29, 2010.

U.S. Appl. No. 12/959,960, Notice of Allowance dated Oct. 25, 2011.

European Patent Application No. 1192479.1, Extended Search Report dated Feb. 3, 2012.

English Translation of Japanese Patent Application No. P2009-523114 Notice of Reasons for Objection dated Jul. 3, 2012.

* cited by examiner

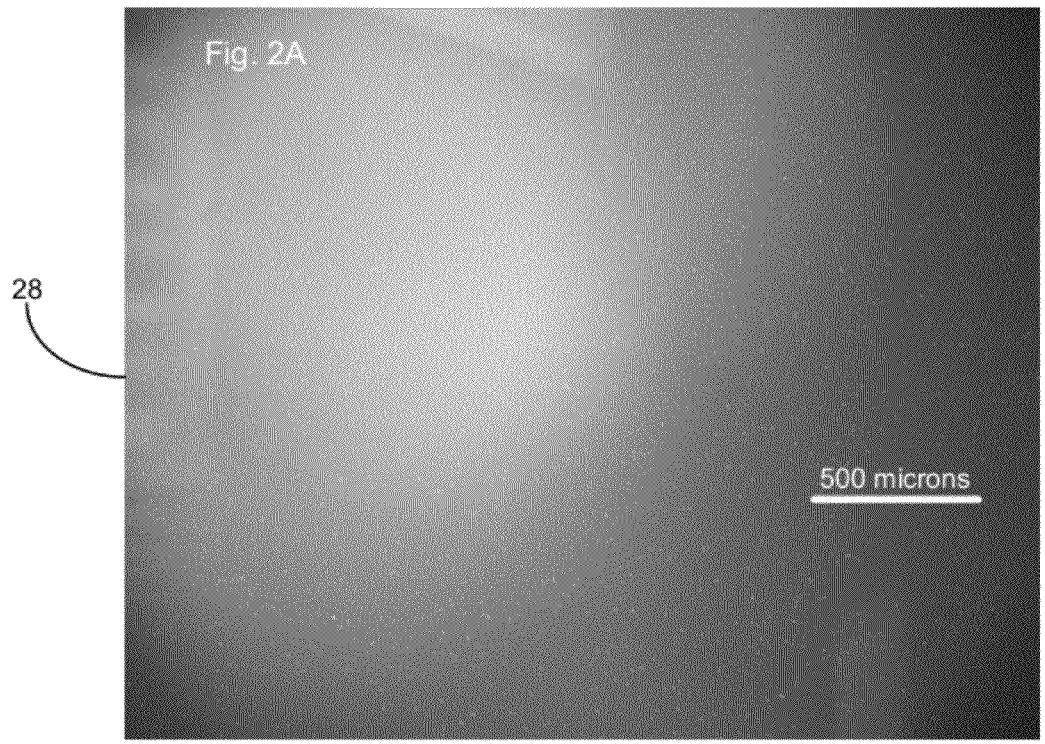

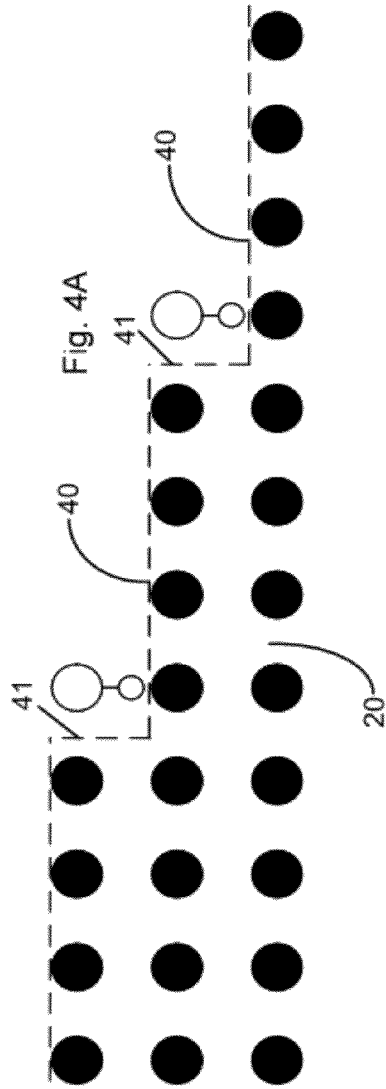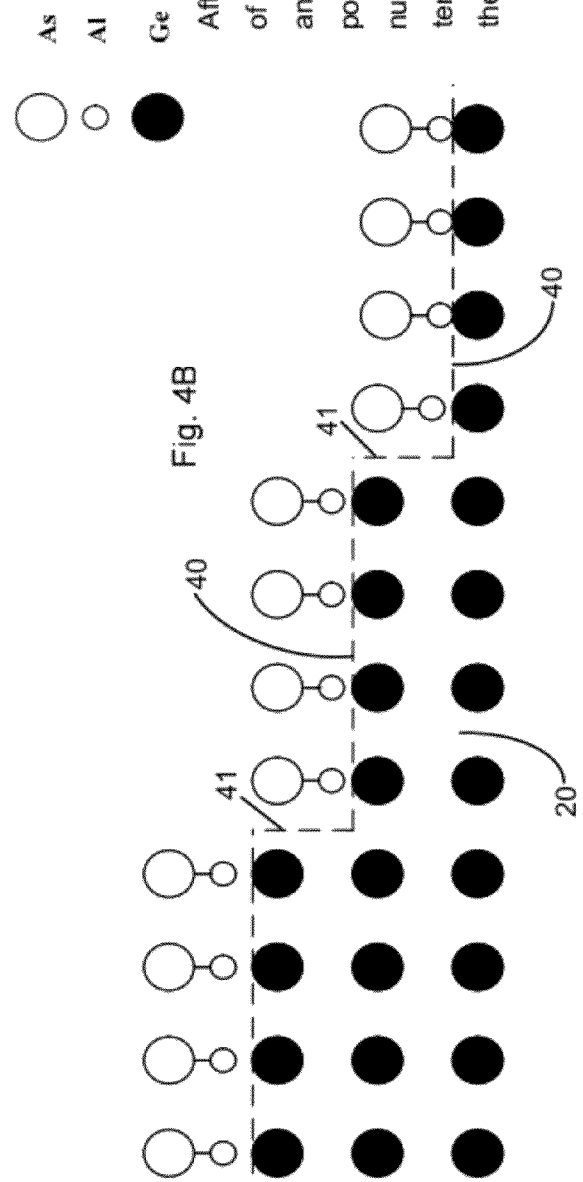

Fig. 4A — At the start of the deposition process the small Al atoms quickly find the energetically preferred steps and kinks, thus laying down the pattern for the III-V semiconductor film Fig. 4B — After the deposition of a monolayer of AlAs all steps have been covered and the transition from non-polar to polar crystal has been created. This nucleation process occurs at temperatures which are typical for the deposition of AlAs epitaxial layers

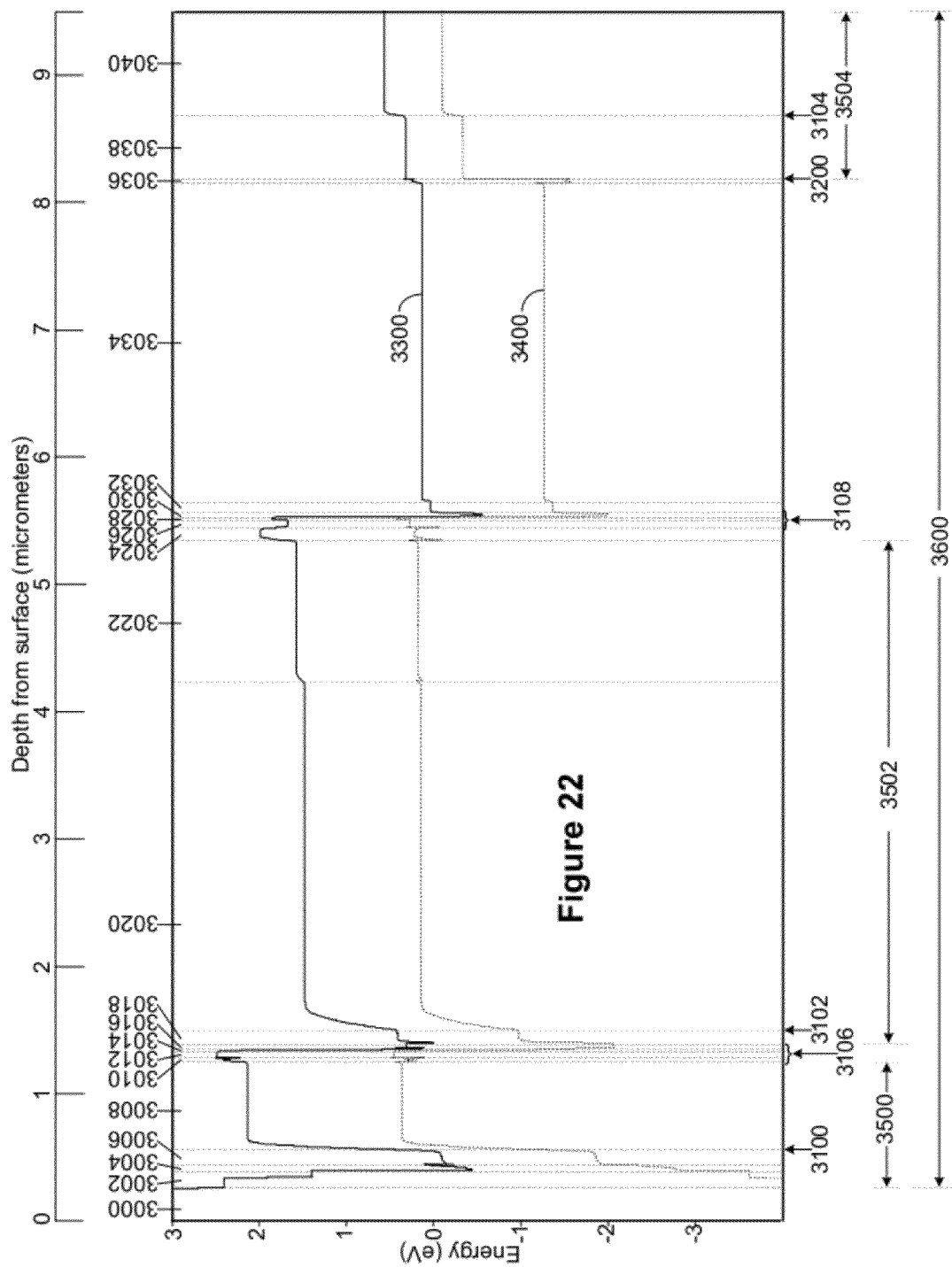

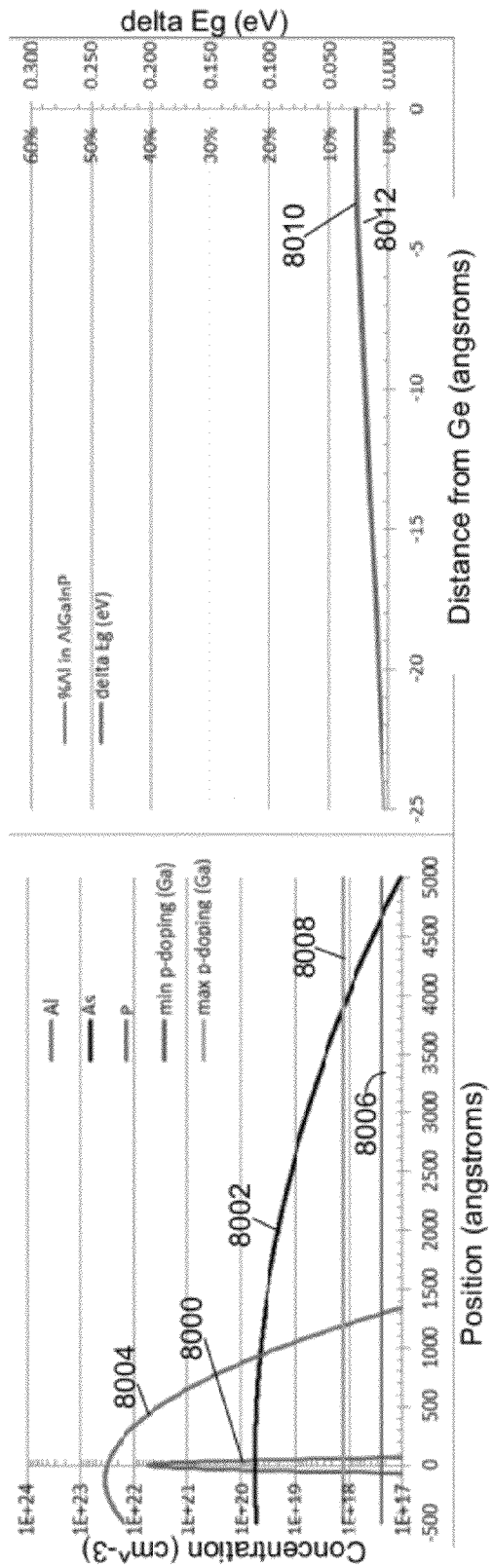

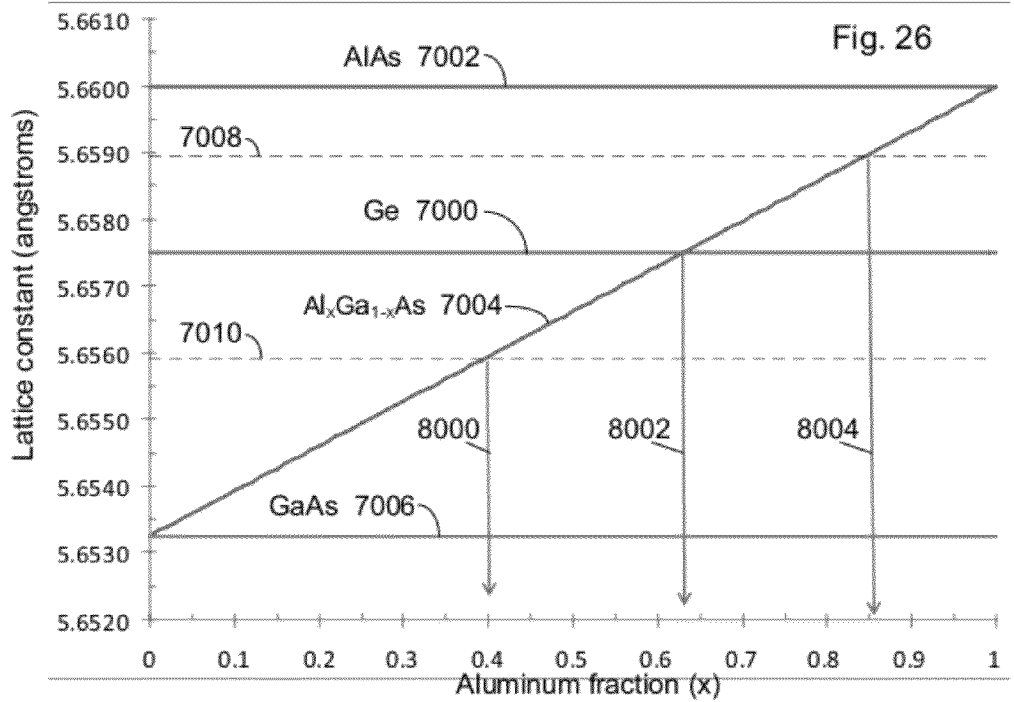
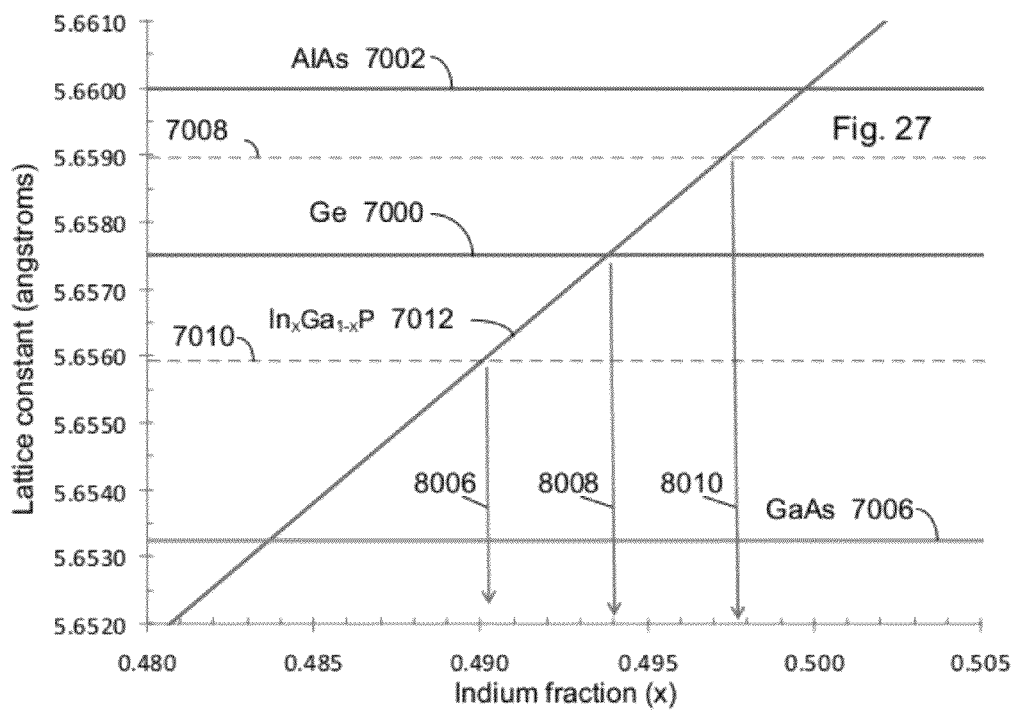

METHOD OF FABRICATING SEMICONDUCTOR DEVICES ON A GROUP IV SUBSTRATE WITH CONTROLLED INTERFACE PROPERTIES AND DIFFUSION TAILS

CROSS REFERENCE TO RELATED APPLICATIONS

This application is a Continuation in Part of patent application Ser. No. 12/959,960, filed Dec. 3, 2010, which is a Continuation of patent application Ser. No. 11/776,163, filed Jul. 11, 2007, which claims the benefit of priority of U.S. Provisional Patent Application No. 60/822,138 filed Aug. 11, 2006, all of which are incorporated herein by reference.

FIELD OF THE INVENTION

The present invention relates generally to the epitaxial deposition of electronic and opto-electronic devices. More particularly, the present invention relates to the deposition of III/V electronic and opto-electronic device structures on group IV substrates.

BACKGROUND OF THE INVENTION

The deposition of layer sequences for III/V opto/electronic devices, such as multi junction solar cells and light-emitting diodes (LEDs), on group IV substrates is known. The electronic and optical properties of such devices are being studied extensively and the correlation between these properties and the characteristics of the substrate-epilayer interface is receiving great attention. The reason for the attention given to the substrate-epilayer interface is that, for the most part, the performance of these devices is determined by the quality of this interface.

When depositing a III/V material, for example GaAs, epitaxially on a group IV substrate, for example a Ge substrate, the formation of the atomic layer sequence of the group III and group V layers is not readily established. That is, the group IV sites (e.g., Ge atoms) can bond either group III or group V atoms. In practice, some areas of the group IV substrate will bond group III atoms and some other areas will bond group V atoms. As such, there are boundary regions between these different growth areas that can give rise to considerable structural defects, such as, for example, anti-phase domains, dislocations, etc, which adversely affect the performance of the device.

To curtail some of these undesired events, the group IV substrates are usually vicinal substrates with an off-cut angle ranging from 0-15°, or any other suitable angle. These vicinal substrates offer terraces and step edges where ad-atoms, that is, atoms arriving at the growth surface, can attach with different bond configurations. That is, various surface reconstructions can occur, e.g., 2×4, 2×2, 4×2, etc., thus providing greater order in the growth process. Some of these surface reconstructions are better adapted to be As-stabilized (arsenic-stabilized) and, as such, surface reconstruction can be an important factor in the III-V growth. Therefore, the off-cut angle, the surface reconstructions, and the growth parameters can affect the semiconductor epitaxy and the layers can have different ways of growing based on that, and on the strain in the epitaxial layers compared to the substrate depending on the relative size of their lattice constants. For example the step-flow growth, the layer-by-layer growth, and the 3D-growth have been observed to occur depending on the conditions as described for example in Lippmaa et al in Applied Physics Letters 76, 2439 (2000) or in other semiconductor growth references. In the Step-flow growth the off-cut (or miscuts) gives rise to atomic steps on the surface. In step-flow growth, atoms land on the surface and diffuse to a step edge before they nucleate a surface island. The growing surface can then be viewed as steps traveling across the surface. This growth mode is typically obtained by deposition on a relatively high off-cut substrate, or depositing at elevated temperatures. In the layer-by-layer growth, islands nucleate on the surface until a critical island density is reached. As more material is added, the islands continue to grow until the islands begin to coalesce into each other. Once coalescence is reached, the surface typically has a large density of pits. When additional material is added to the surface the atoms diffuse into these pits to complete the layer. This process repeats itself for each subsequent layer. The 3D growth is similar to the layer-by-layer growth, except that once an island is formed an additional island will nucleate on top of the first island. Therefore the growth does not persist in a layer by layer fashion, and the surface roughens each time material is added.

In devices such as, for example, solar cells having III/V compounds epitaxially deposited on a group IV substrate, it is often desirable to create part of the device itself in the group IV substrate by diffusing, for example, a group V species in the group IV substrate. As an example, for solar cells, if a group V element is diffused in a p-type Ge substrate, an n-type region is formed, giving rise to a p-n junction. This p-n junction becomes photo-active and can be part of a single or multijunction solar cell. However, when depositing the III/V compound at typical process temperatures (500-750° C.) on the Ge substrate, the group V element of the compound tends to diffuse, with little control, in the substrate thereby making the formation of a predictable p-n junction difficult. In cases involving group IV substrates with a pre-existing p-n junction, as could be the case in the hetero-integration of III-V opto/electronics on Ge, SiGe and SiC electronic circuits, the deposition of an overlaying III/V compound can modify the doping profile of the pre-existing p-n junction resulting in subpar performance of the p-n junction and device. Consequently, the electrical characteristics are not easily controllable. In such situations, it can become quite difficult, if not impossible, to attain and maintain the desired doping profile and the electrical characteristics of the substrate's p-n junction, such electrical characteristics including, in the case of solar cells, the open circuit voltage (Voc).

Furthermore, when depositing the III-V layers, the group IV atoms will diffuse from the substrate into the epitaxially deposited III/V layers. Hence, layers within the initial 0.5-1 μm of the III/V layer sequence can be highly doped with the group IV element when the excessive diffusion of group IV atoms is not curtailed through the use of suitable nucleation conditions and materials. Group IV atoms like Si and Ge are, at moderate concentrations, typically n-type dopants in III/V semiconductor materials. However, due to their amphoteric nature (i.e., the fact that they can generally act as n-type or p-type dopants at large concentrations in III/V semiconductor materials) these atoms can cause a large degree of compensation (combined incorporation of n- and p-type impurities) when incorporated at concentrations much larger than $2 \times 10^{18}$ $cm^{-3}$, often leading to a strong deterioration of electrical and optical properties of the host semiconductor layer.

U.S. Pat. No. 6,380,601 B1 to Ermer et al., hereinafter referred to as Ermer, teaches deposition of GaInP on an n-doped interface layer formed on a p-type Ge substrate, and subsequent deposition of a GaAs binary compound on the GaInP layer. The phosphorous of the GaInP layer tends to not diffuse in the Ge substrate as deeply as the arsenic of a GaAs layer would. Thus, the phosphorous doping and subsequent deposition of the GaInP layer allows better control of the doping profile of the n-type layer of the Ge substrate and consequently, leads to a better control of the electrical characteristics of the p-n junction formed in the Ge substrate. However, the problem with having a GaInP interfacial layer at the Ge substrate interface is that the morphology of devices prepared under typical epitaxial process conditions for these materials is not ideal: defects often abound. As defects generally act as recombination sites for electrical charge carriers (electrons and holes), the performance of such devices is generally not good as the number of defects is high. It would appear that extreme nucleation conditions (temperature, deposition rate, group V overpressure) of the Ermer GaInP interfacial layer are required in order to obtain devices with suitable morphology.

Improvements in III/V devices and structures formed on group IV substrates are therefore desirable.

SUMMARY OF THE INVENTION

In a first aspect, there is provided a multi junction solar cell. The multi-junction solar cell comprises a group IV layer having a surface defined by a (100), (010) or (001) plane inclined, at an angle ranging from 0° to 20°, towards a (111) plane of the group IV layer, the (100), (010) or (001) plane containing group IV elements spaced-apart by a group IV layer in-plane lattice parameter. The multi junction solar cell further comprises a nucleation layer formed on the surface of the group IV layer, the nucleation layer including a III-V compound having at least aluminum (Al) as a group III element and at least one of arsenic (As), nitrogen (N) and antimony (Sb) as a group V element; and, the multi junction solar cell comprises at least one additional layer containing a III-V compound, the at least one additional layer being formed on the nucleation layer, the at least one additional layer and the nucleation layer each having, in a direction substantially parallel to the (100), (010) or (001) plane, a lattice parameter substantially equal to the group IV layer in-plane lattice parameter, the solar cell including a first p-n junction formed in the group IV layer and a second p-n junction formed in the at least one additional layer.

In another aspect, there is provided a multi junction solar cell. The multi-junction cell comprises a group IV layer having a surface defined by a (100), (010) or (001) plane inclined, at an angle ranging from 0° to 20°, towards a (111) plane of the group IV layer, the (100), (010) or (001) plane containing group IV elements spaced-apart by a group IV layer in-plane lattice parameter. The multi junction solar cell also comprises a nucleation layer formed on the surface of the group IV layer, the nucleation layer including a III-V compound, a thickness of the nucleation being comprised between 0.25 monolayer of the III-V compound and one monolayer of the III-V compound; and, the multi junction solar cell comprises at least one additional layer containing a III-V compound, the at least one additional layer being formed on the nucleation layer, the at least one additional layer and the nucleation layer each having, in a direction substantially parallel to the (100), (010) or (001) plane, a lattice parameter substantially equal to the group IV layer in-plane lattice parameter, the solar cell including a first p-n junction formed in the group IV layer and a second p-n junction formed in the at least one additional layer.

In yet another aspect there is provided a multi junction solar cell that comprises a group IV layer having a surface defined by a plane. The plane contains group IV elements spaced-apart by a group IV layer in-plane lattice parameter. The group IV layer has a p-n junction formed therein. The solar cell also comprises a nucleation layer formed on the surface of the group IV layer. The nucleation layer has a nucleation layer thickness The nucleation layer includes a III-V compound that has at least aluminum (Al) as a group III element and at least one of arsenic (As), nitrogen (N) and antimony (Sb) as a group V element. The solar cell further comprises at least one additional layer that contains a III-V compound. The at least one additional layer is formed on the nucleation layer. The at least one additional layer has, in a direction substantially parallel to the plane of the group IV layer, a lattice parameter substantially equal to the group IV layer in-plane lattice parameter. The p-n junction has a p-doped base and an n-doped emitter. The n-doped emitter is defined by at least two n-type dopants, each n-type dopant having associated thereto a respective concentration that varies as a function of distance from the group IV surface. One of the n-type dopants is a group V element, from the at least one additional layer, that has diffused from the at least one additional layer into the group IV layer. Another of the n-type dopants is a group V element, from the nucleation layer, that has diffused from the nucleation layer into the group IV layer.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 2A and 2B are photographs of embodiments of the present invention with different thickness of an AlAs nucleation layer.

FIG. 22 shows a bandgap and a band edge profile for a three junction solar cell.

FIG. 24A shows a second example of simulated diffusion profiles for the Al, As and P at a Ge/GaInP interface.

FIG. 24B shows a plot of the Al composition and calculated bandgap offset in relation to the simulated diffusion profiles of FIG. 24A.

FIG. 26 shows a plot of the lattice constant of $Al_xGa_{1-x}As$ as a function of aluminum fraction.

FIG. 27 shows a plot of the lattice constant of $In_xGa_{1-x}P$ as a function of Indium fraction.

DETAILED DESCRIPTION

Figure 1:
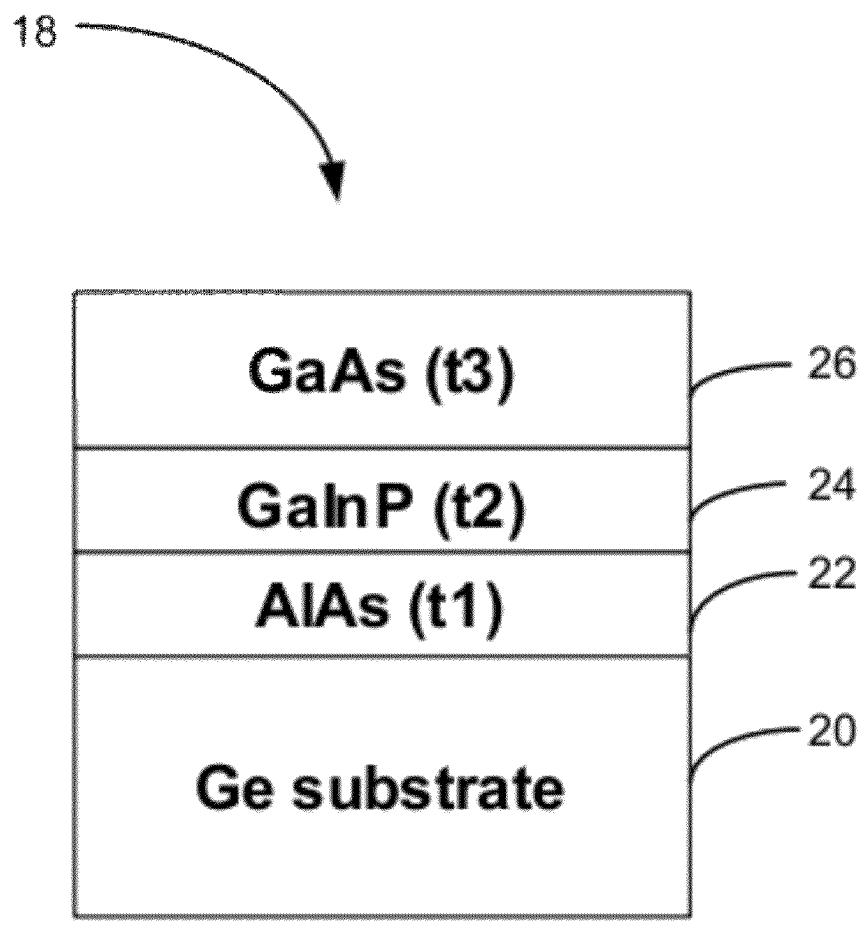
FIG. 1 is a side view of an embodiment of the present invention.

The present disclosure provides a multi junction solar cell that includes a group IV substrate upon which a III-V layer structure is formed. The solar cell has a morphology with a substantially low defect density and a controlled doping profiles of group V constituents into the group IV substrate and group IV constituents into the III-V layers.

The present disclosure also provides a method for fabricating a multi junction solar cell having a group IV substrate upon which a III/V layer structure is formed. The method allows for the manufacturing of solar cells with a low defect-density morphology and controlled doping profiles of group V constituents into the group IV substrate and group IV constituents into the III/V layers.

More generally, the present disclosure encompasses the formation of a III-V layer, or of multiple III-V layers, on a nucleation layer formed on a group IV layer, the group IV layer having an orientation such that the growth of the III-V layer directly on the group IV layer would typically lead to anti-phase defects or dislocations in the III-layer.

For the purpose of the present disclosure, the expression "pseudomorphic layer" is to be understood as meaning a layer that has essentially the lattice constant of the material upon which it is formed rather than the lattice constant normally characteristic of its own composition. For example, a III-V compound pseudomorphic layer formed on a group IV layer will have substantially the same lattice constant as that of the group IV layer. Further, a pseudomorphic layer can have only its in-place lattice constant equal to the in-plane lattice constant of the material upon which the pseudomorphic layer is formed. In the context of the present disclosure, the expression "in-plane lattice constant" is to be understood as meaning the spacing between atoms disposed in the growth plane (epitaxial growth plane) of the semiconductor structure or device. Growth of the semiconductor structure or device is occurs perpendicular to the growth plane. The lattice constant of the pseudomorphic layer that is perpendicular to the in-plane lattice constant need not be equal to the in-plane lattice constant. It can in fact be the same, larger, or smaller that the in-plane lattice constant. In strain-balanced configuration, the strain/stress energy of the materials under compressive or tensile strain can be accommodated with deformations and the elastic properties of the materials, as long as the strain-thickness product is kept below the critical thickness as mentioned previously, for example as described by the Matthews-Blakeslee critical layer thickness. The coherently strained pseudomorphic layers can undergo a vertical tetragonal elongation or compression to accommodate the in-plane lattice constant following a Poisson effect which can be linear or not, depending on the elastic properties, the Young's modulus, the shear modulus, and bulk modulus of the materials involved. A pseudomorphic layer can also be referred to as being a coherent layer with respect to the layer upon which the pseudomorphic layer is formed.

Further, for the purpose of the present disclosure, the expression "metamorphic layer" is to be understood as meaning a layer that does not have the same morphology as that of the layer upon which it is formed. Generally, the in-plane lattice constant of a metamorphic layer is different than the in-plane lattice constant of the material upon which the metamorphic layer is formed (by epitaxy or otherwise). As will be understood by the skilled worker, pseudomorphic layers generally have fewer defects than metamorphic layers.

The Miller conventions used in the present disclosure to describe crystal orientations (or directions), crystal planes, families of orientations, and families of planes are as follows. The [ ] notation is used to identify a specific direction; for example, the [100] direction. The < > notation is used to identify a family of equivalent directions; for example, the <100> family of directions, which includes the directions [100], [010] and [001]. The ( ) notation is used to identify a specific plane; for example, the (100) plane. The { } notation is used to identify a family of planes; for example, the {100} family of planes, which includes the planes (100), (010) and (001).

FIG. 1 shows an exemplary three layer semiconductor structure 18 embodying the present invention. Such a structure can be used in multi junction solar cells, e.g., as the epitaxial basis and a first junction in a three junction solar cells. Further, as will be readily understood by a worker skilled in the art, similar structures can be used in light-emitting diodes (LEDs) and other electronic and/or opto-electronic devices. In the example of FIG. 1, an AlAs layer 22 of thickness $t_1$ is deposited atop a vicinal [100]-oriented Ge substrate 20. As will be understood by a worker having ordinary skill in the art, the term "vicinal" here refers to a crystal plane that is oriented near to a fundamental plane, in the present example, the (100) plane. Even though the Ge substrate 20 of the present example has a [100] orientation, others orientation are possible without departing from the scope of the present disclosure. For example, other orientations of the <100> family of orientations, that is, the [010] and [001] orientations are also possible.

In the present example, the angle of the vicinal [100]-oriented Ge substrate can range from, for example, 0°-20°; the crystal orientation of the Ge substrate can be, for example, 6° towards the [111] orientation, or towards any other suitable orientation.

On top of the AlAs layer 22 are a GaInP layer 24 having a thickness $t_2$ and a GaAs layer 26 having a thickness $t_3$. The deposition of the AlAs layer 22, the GaInP layer 24 and the GaAs layer 26 can be achieved through any suitable means such as: metal organic chemical vapor deposition (MOCVD), chemical beam epitaxy (CBE), molecular beam epitaxy (MBE), solid phase epitaxy (SPE), hydride vapour phase epitaxy or by other similar hybrid systems or combinations thereof. Although a Ge substrate 20 is shown, any other suitable group IV substrates, such as, e.g., Si, SiGe or SiC substrates, can also be used without departing from the scope of the present disclosure. Further, as will be understood by the skilled worker, the present disclosure also applies in cases where, instead of a group IV substrate, a device requiring transition from a group IV material to a III-V compound is used, regardless of whether or not the group IV material is a substrate, an epitaxially grown group IV layer, or a group IV layer formed by any other suitable process. Similarly, the AlAs layer can be substituted, without departing from the scope of the present invention, with other III-V compound semiconductor alloys with a high concentration of Al such as, for example, AlN, AlSb or $Al_xGa_{1-x}As$, with x being at least 0.25.

In FIGS. 2A and 2B, the morphology of the structure 18 is compared for two different thicknesses $t_1$ of the AlAs layer 22. In FIGS. 2A and 2B, a test structure 28 corresponds to the structure 18 with $t_1$=0 and a test structure 30 corresponds to test structure 18 with $t_1$=4 monolayers of AlAs. FIGS. 2A and 2B show microscope photographs of the top surface of tests structures 28 and 30 where in each case $t_2$=0.025 μm and $t_3$=0.2 μm. The test structures 28 and 30 were fabricated by MOCVD at temperatures ranging from 650-730° C. with the deposition rates of GaAs, GaInP and AlAs being respectively 4 μm/hr, 0.8 μm/hr and 0.7-0.42 μm/hr.

As seen in FIG. 2A (GaInP on Ge), the number of defects, shown as white speckles, is much higher than if FIG. 2B (AlAs on Ge). The density of defects is of the order of thousands per $cm^2$ in FIG. 2A and substantially nil in FIG. 2B. The defects observed can be attributed to anti-phase domains defects (e.g., see Material Science and Eng, B42 (1996) 204-207, B. D. Holt et al "Properties and structure of antiphase boundaries in GaAs/Ge solar cells"). This type of defect is entirely absent on FIG. 2B. The large speckle in the central region of FIG. 2B it is attributed to a foreign particle on the test structure 30, which is not inherent to the nucleation process.

Figure 3:
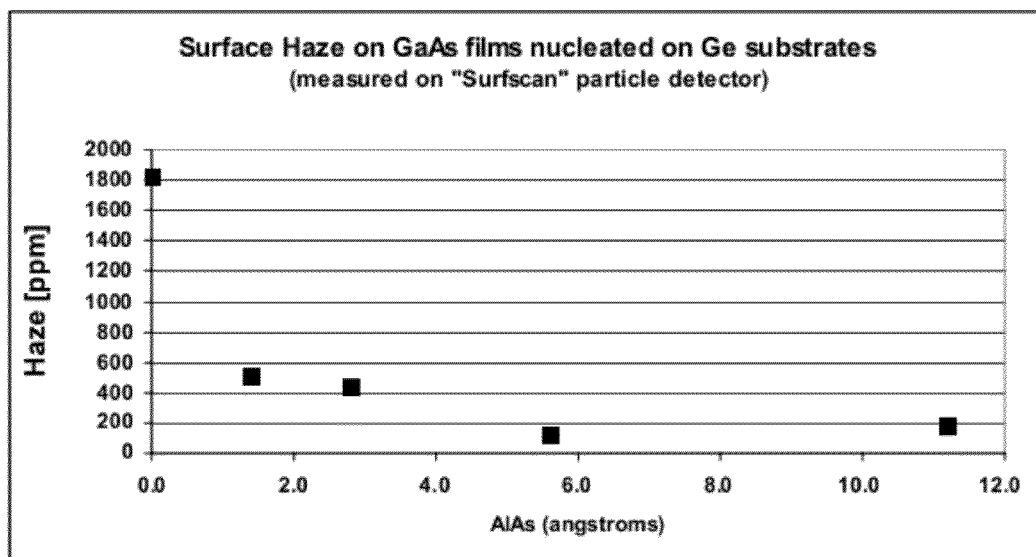
FIG. 3 is a haze measurement of the embodiment of FIG. 1 as a function of thickness of the AlAs nucleation layer.

The graph of FIG. 3 shows a haze plot for the structures 18 as a function of $t_1$, the thickness of the AlAs layer 22. A haze measurement represents the surface quality of the structures as a number of defects on the surface of the structures. The thickness of the AlAs layer (bi-layer) is calculated in accordance with calibration data of the growth chamber in which the structures are prepared, the calibration data depending on growth parameters of the AlAs layer 22. Such growth parameters include the Ge substrate temperature, the partial pressures of the Al and As carrier gases, and the exposure time of the substrate to the carrier gases. A uniformly grown AlAs layer has a thickness of about 5.6 Å (0.56 nm). The measurements shown at FIG. 3 were performed with a Surfscan™ haze measurement apparatus manufactured by KLA-Tencor of California.

It is very clear from the haze plot that adding just a fraction of a monolayer of AlAs greatly improves the surface morphology of the structure 18. That is, growing as little as about 1.5 Å of AlAs (about 0.27 monolayer) improves the surface morphology. That is, it reduces the number of defects.

The growth conditions of the samples measured to produce the plot of FIG. 3 were such as to favor the binding of Al atoms on the Ge-substrate, and to have the As atoms bond preferentially to the Al atoms. As such, the thickness of the AlAs layer shown as the abscissa in FIG. 3 is to be interpreted as an average thickness of AlAs coverage of the Ge-substrate. For example the data point having an AlAs thickness of about 5.6 Å corresponds to a one AlAs layer average coverage of the Ge-substrate surface. The data point having an AlAs thickness of about 1.5 Å corresponds to a one AlAs layer average coverage of about 27% of the Ge-substrate surface. The data point having an AlAs thickness of about 2.8 Å corresponds to a one AlAs layer average coverage of about 50% of the Ge-substrate surface. etc.

The reason for the improvement in the morphology of III/V compounds deposited on vicinal Ge substrates with an intermediate AlAs layer 22 between the Ge substrates and subsequent III/V compounds is attributable to the following. As shown in FIGS. 4A and 4B, Al atoms are relatively small with respect to As atoms. As such, the Al atoms have an electrochemical potential that favors their positioning at the steps 40, which are present on the vicinal, [100]-oriented Ge substrate 20. Thus, introducing Al and As in the growth chamber and allowing a suitable time to pass (typically well within the time it takes to deposit the layer at the pre-determined growth rate and growth temperature) will see the steps 40 predominantly occupied by Al atoms provided that the surface energy is high enough to allow surface reconfigurations due to the substrate temperature. For example, at a growth rate of 1 angstrom/second, it takes a few seconds to grow 1 monolayer of material, whereas the adatom reconfiguration can be much faster depending on the growth parameters. This allows for the establishment of a homogeneous growth sequence, which leads to morphologically sound samples as shown in FIG. 2B in which the nucleation sequence has been properly established and therefore, the anti-phase domain defects have been greatly reduced. This process is known as a nucleation process and, in the case depicted in FIGS. 4A and 4B, can occur at temperatures typical in depositing AlAs layer epitaxial layers (e.g., 650-730° C.).

Further, in the case of Ge vicinal substrates, and under growth conditions described above, Al atoms will tend to diffuse along the surface of the substrate and reach a corner location on the steps 40, adjacent a wall 41 extending to a next step 40, and bind to the substrate at that corner location. Upon the corner location being occupied by an Al atom, a subsequent Al atom can bind to the corner location defined by an Al atom and a Ge atom. This is a growth mode known in the art as step flow growth. FIG. 4B shows a one AlAs layer (bi-layer) uniform coverage of the Ge substrate 20. The As atoms will have a tendency to bind mostly to the Al atoms.

Figure 4C:
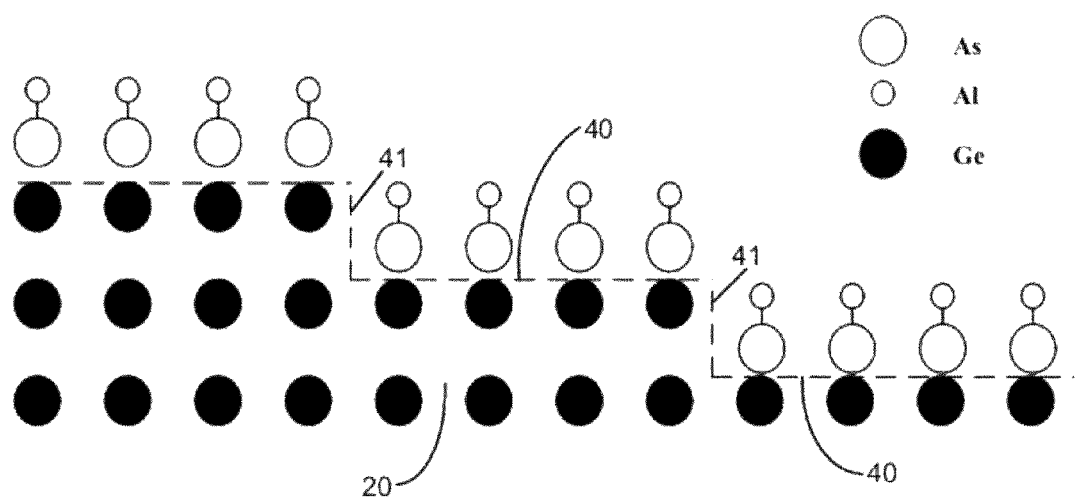
FIG. 4 is a depiction of the deposition process of AlAs on a vicinal Ge substrate.

Under certain growth conditions, which can include low temperature molecular beam epitaxial growth in an As overpressure, or Migration Enhanced Epitaxial growth mode in which the group IV is exposed first to an As cycle, it is possible to have the order of group III and group V atoms reversed with respect to the scenario shown at the example of FIGS. 4A and 4B. That is, under such growth conditions, it is possible to have the group V atoms bind to the group IV substrate and the group III atom bind to the group V atoms. This is shown in the example of FIG. 4C.

Depending on the growth parameters, when less than 1 monolayer is deposited on the growth surface, the adatoms can either distribute themselves randomly on the growth surface, or can position themselves preferentially on portions of the growth surface that is energetically favorable. For example, front edges (see FIG. 4B, region where a wall 41 connects a step 40 to a lower step 40) and back edges (see FIG. 4B, region where a wall 41 connects a step 40 to a higher step 40) of terraces defined on the growth surface may not have the same surface energy balance, and these front and back edges may have a different energy balance than a location on the terrace that is away from the front and back edges. These different surface energy configurations can help set the growth sequence of group III and group V atoms even if the less than one monolayer of the nucleation layer is deposited on the growth surface.

Figure 5:
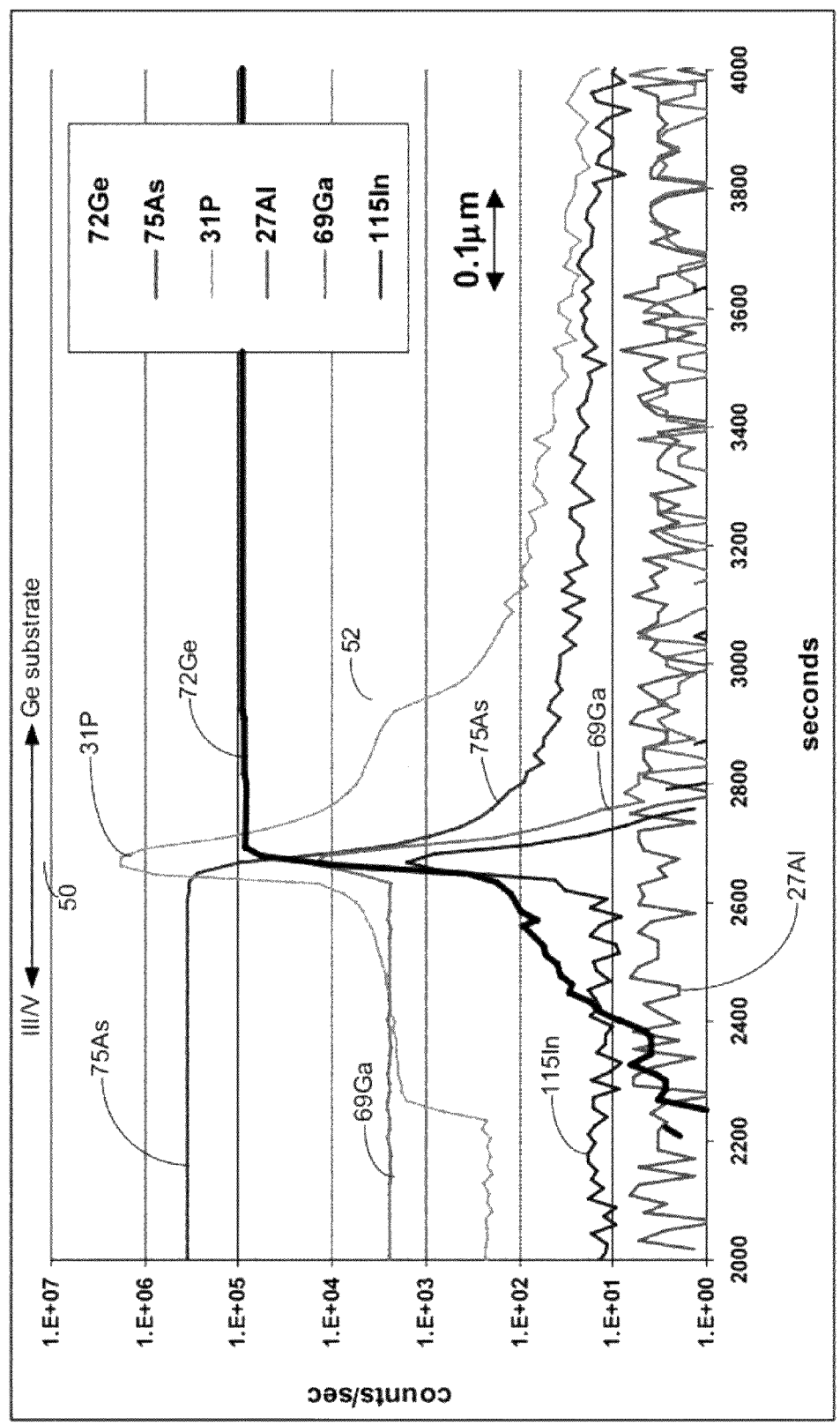
FIG. 5 is a graph of SIMS data for different atomic species of the structure of the embodiment of FIG. 1 when the thickness of the AlAs layer is nil.

FIG. 5 shows a secondary ion mass spectroscopy (SIMS) measurement performed on a test structure similar to that of the test structure 28 of FIG. 2A, i.e., the structure 18 with $t_1=0$. The line 50 indicates the boundary between the Ge substrate 20 and the III/V compound. As seen in the SIMS plots of FIG. 5, atomic masses 72 (Ge), 75 (As), 31 (P), 27 (Al), 69 (Ga) and 115 (In) are measured as a function of exposure time to a beam of Cs atoms accelerated by a 3 kV voltage. A depth scale relating the exposure time to the depth probed by the SIMS beam is shown. Of note is that the germanium isotope 72 is measured instead of the prevalent germanium 74. This is done in order to avoid any interference with the measurement of As, which has an atomic mass of 75.

As indicated by region 52 of the graph, the diffusion of P occurs into the Ge substrate and dominates all other species diffusion. This leads to high levels of n-type conductivity in the Ge substrate, which are not always desirable. The presence of such levels of P in the Ge substrate can lead to low reverse breakdown voltages, which are not tolerable. In such structures, the diffusion of P in the Ge substrate can only be controlled through temperature and thickness (growth time) of the GaInP nucleation layer on the Ge substrate. This makes for a very difficult control of the parameters of the p-n junction in the Ge substrate.

Consequently, structures such as shown in FIG. 2A where $t_1=0$, i.e., structures having GaInP deposited directly on a Ge substrate at a temperature ranging from 650-730° C. at a growth rate of 0.8 μm/hr, not only exhibit poor morphological qualities (large number of defects in haze plot of FIG. 3) but also have an essentially uncontrollable n-type doping deep into the Ge substrate. In cases where the doping profile is acceptable, the poor morphology of resulting devices will typically result in lower opto-electronic performance.

Figure 6:
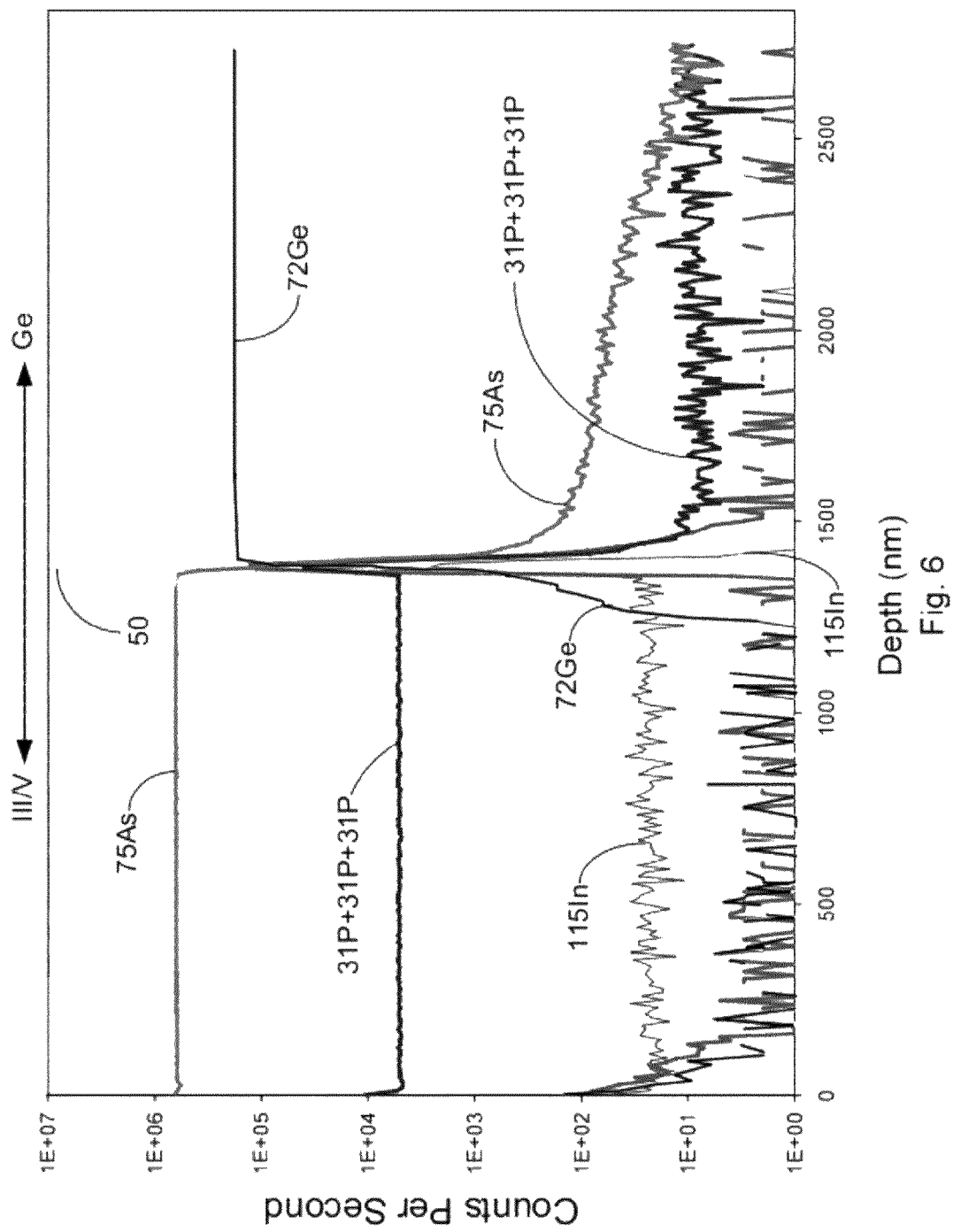
FIG. 6 is a graph of SIMS data for different atomic species of the structure of the embodiment of FIG. 1 when the thickness of the AlAs layer is 11.6 Å.

FIG. 6 shows SIMS measurements performed on the test structure 30 of FIG. 2B, i.e., the sample having $t_1=4$ monolayers (of AlAs) on top the Ge substrate 20. The line 50 indicates the boundary between the Ge substrate 20 and the III/V compound. As seen in the SIMS plots of FIG. 6, atomic masses 72 (Ge), 75 (As), 31+31+31 (triple ion P), 69 (Ga) and 115 (In) are measured as a function of exposure time to a beam of Cs atoms accelerated by a 3 kV voltage.

Clearly, the diffusion of P in the Ge substrate is much smaller than that shown in FIG. 5. The diffusion depth of P in the Ge substrate is approximately 0.02 μm and the diffusion of As in the Ge substrate is approximately 0.10 μm. Thus, when fabricating structures similar to the structure 18 for solar cells, LEDs or other opto-electronic or electronic devices, it is much easier to control the doping profile in the Ge substrate when a high-Al containing alloy such as AlAs is used for the nucleation layer.

Figure 7A:
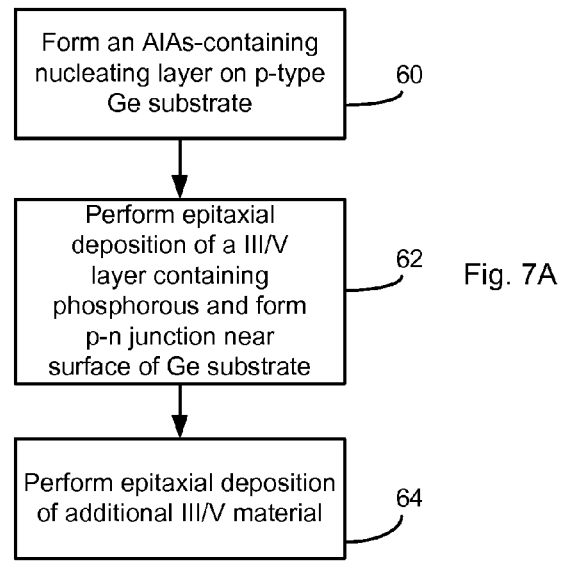
FIG. 7A is a flow chart of a method of the present invention.

FIG. 7A depicts processing steps for structures such as the structure 18 of FIG. 1. At step 60, a nucleation layer containing AlAs is formed on a p-type group IV substrate. At step 62, epitaxial deposition of a III/V layer containing phosphorous is performed together with the formation of a p-n junction in the p-type group IV substrate, proximate the surface of the substrate upon which the nucleation layer was formed. This is followed by step 64, where epitaxial deposition of additional semiconductor materials is performed as required.

Figure 7B:
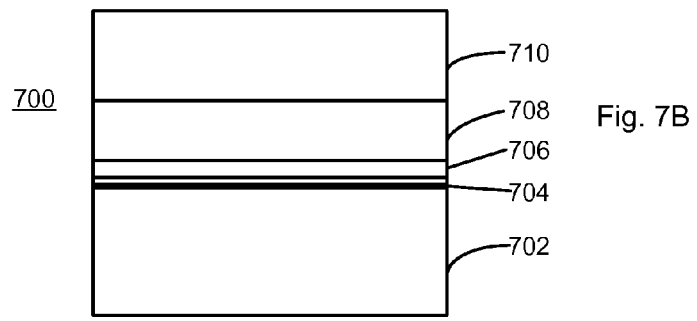
FIG. 7B shows an embodiment of a device fabricated in accordance with the method shown at FIG. 7A.

FIG. 7B shows an exemplary semiconductor device 700 fabricated in accordance with the method shown at FIG. 7A. The device 700 includes a p-type Ge substrate 702 having formed therein a p-n junction 704. The Ge substrate 702 has an AlAs nucleation layer 706 formed thereon. The AlAs nucleation layer 706 has a phosphorous-containing III-V layer 708 formed thereon. Further, another layer of III-V material 710 is formed on the phosphorous-containing III-V layer 708.

Figure 7C:
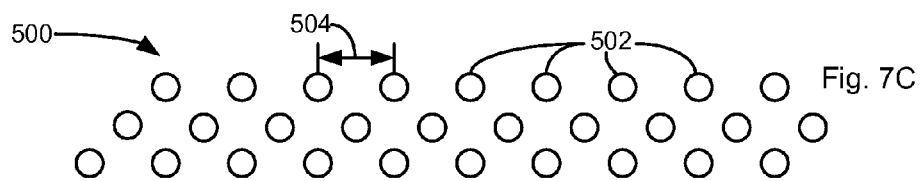
FIG. 7C shows a group IV layer that has elements spaced-apart by an in-plane lattice parameter of the group IV layer.

FIG. 7C shows a side view of a group IV layer 500, which can be, for example, a Ge substrate. As shown at FIG. 7C, the elements 502 of the group IV layer 500 are spaced-apart by an in-plane lattice parameter 504 of the group IV layer 500.

Figure 8:
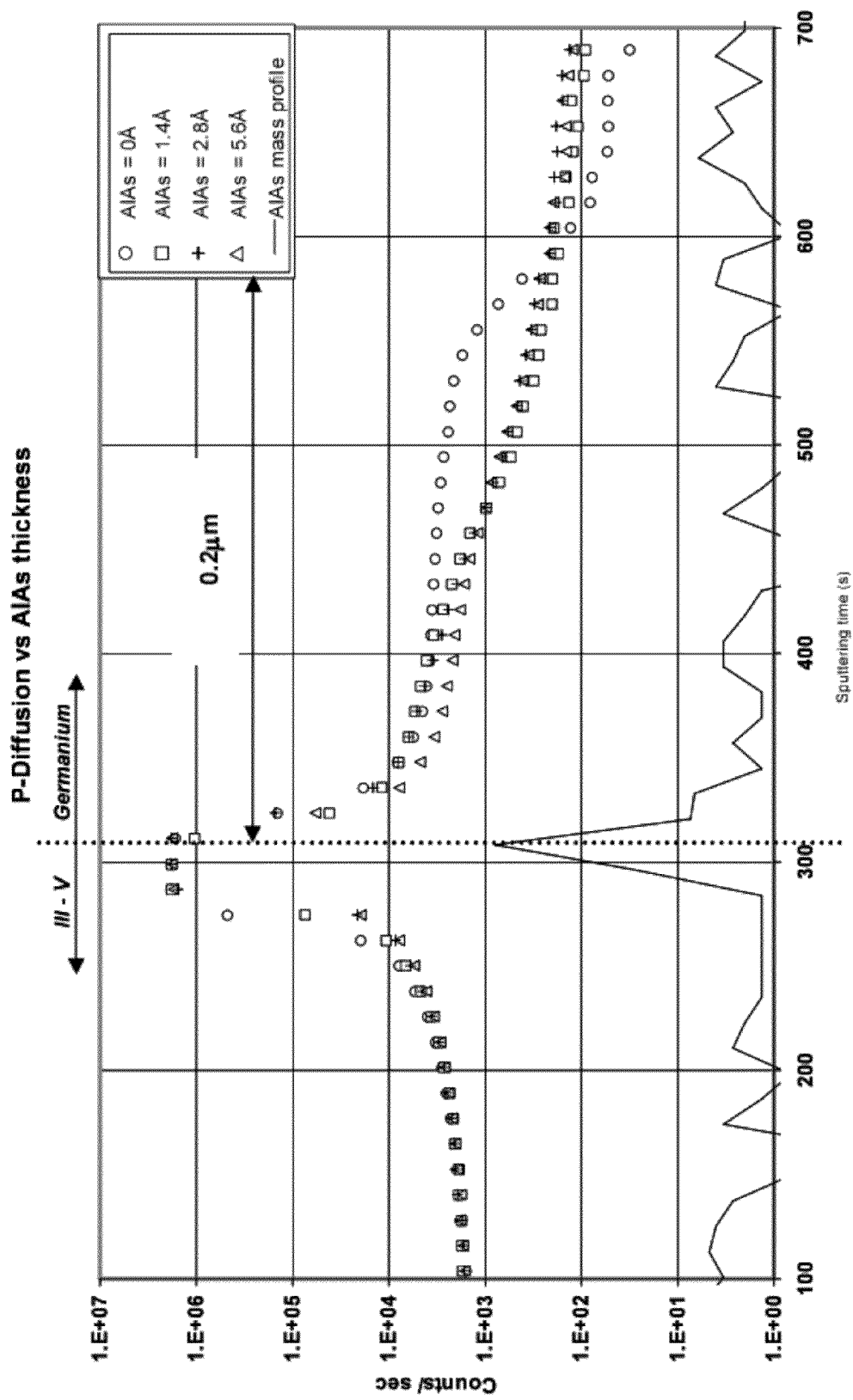
FIG. 8 is a graph of SIMS data for Phosphorous as a function of the thickness of AlAs for the structure of the embodiment of FIG. 1.
Figure 9:
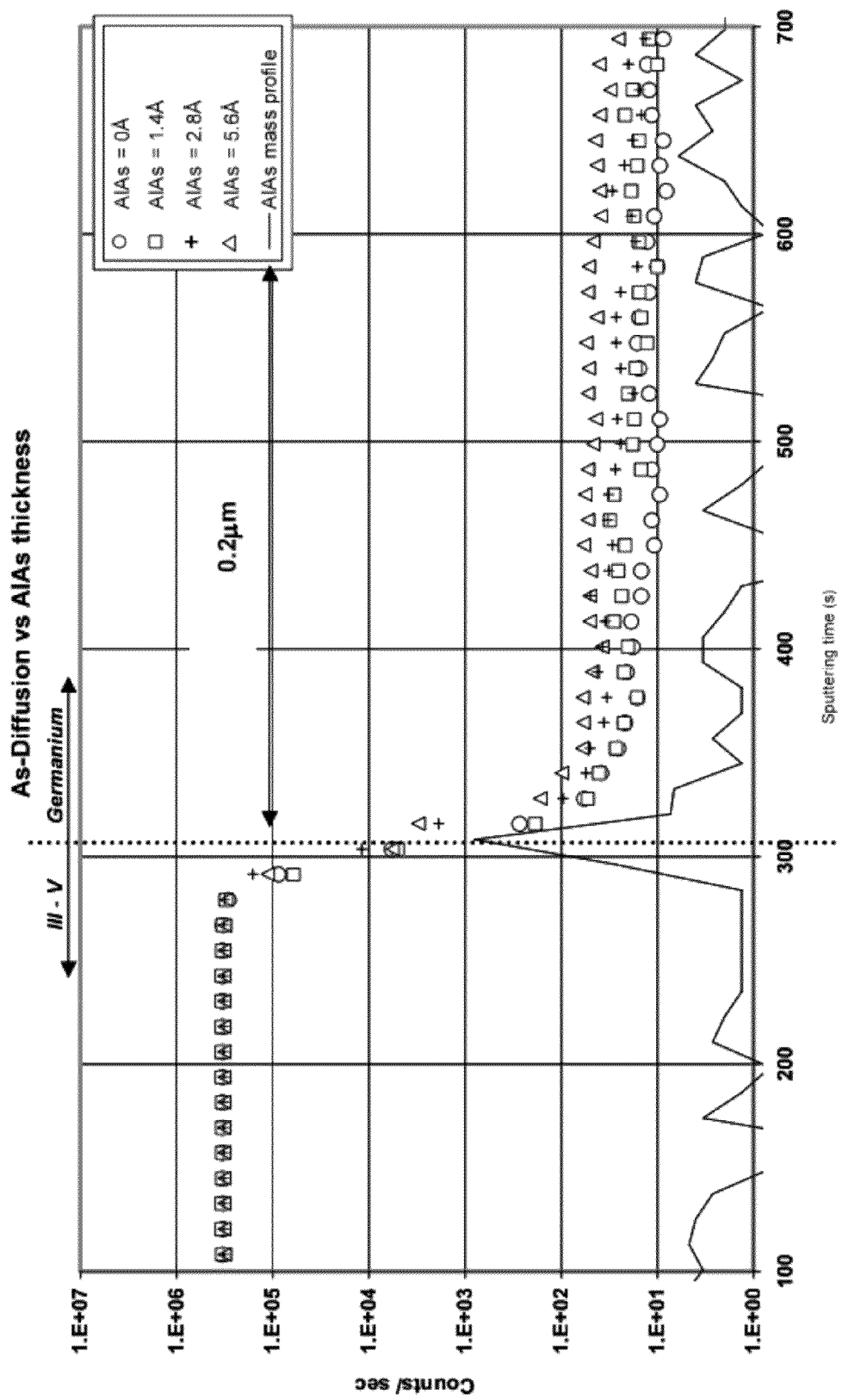
FIG. 9 is a graph of SIMS data for Arsenic as a function of the thickness of AlAs for the structure of the embodiment of FIG. 1.
Figure 10:
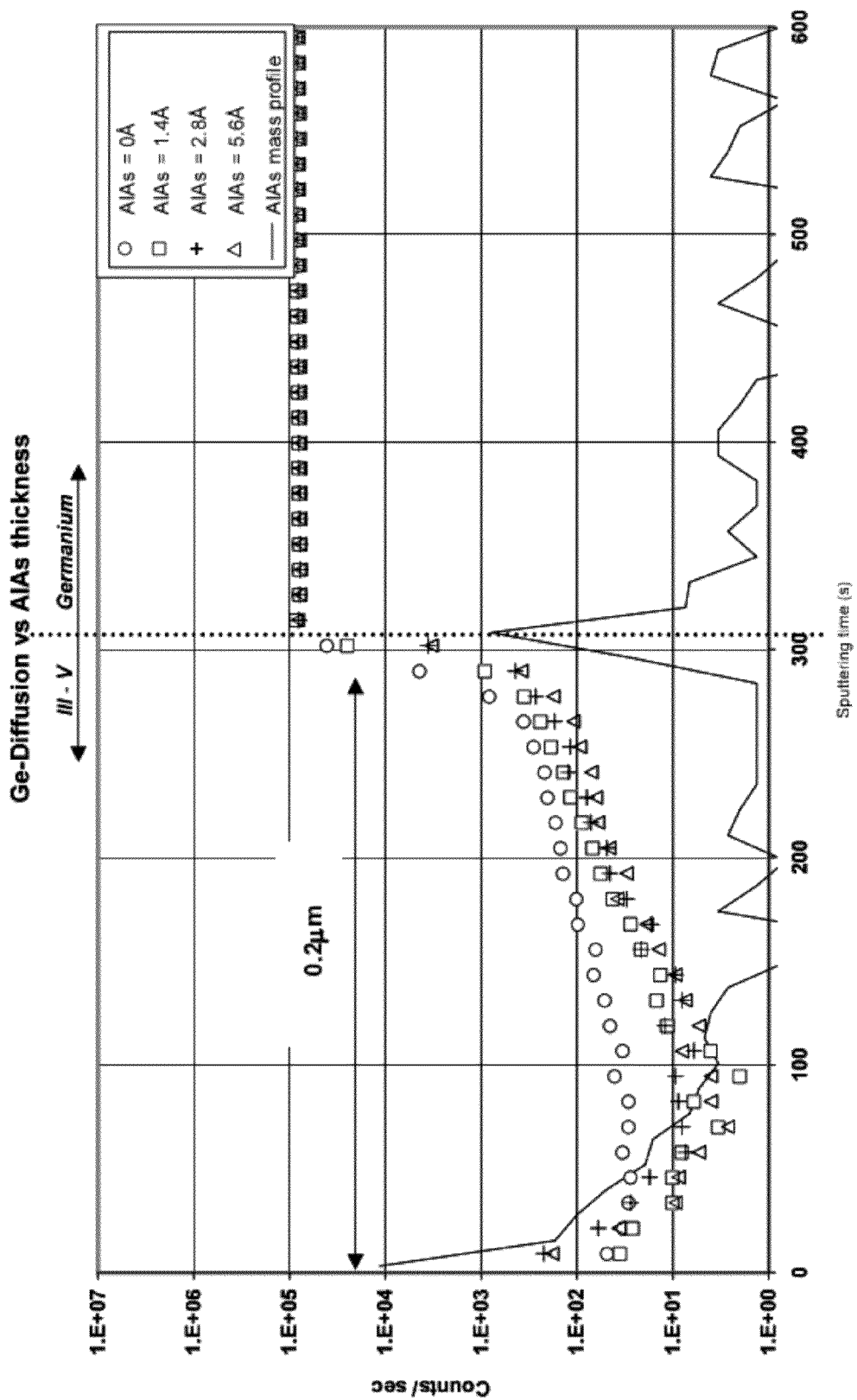
FIG. 10 is a graph of SIMS data for Ge as a function of the thickness of AlAs for the structure of the embodiment of FIG. 1.
Figure 11:
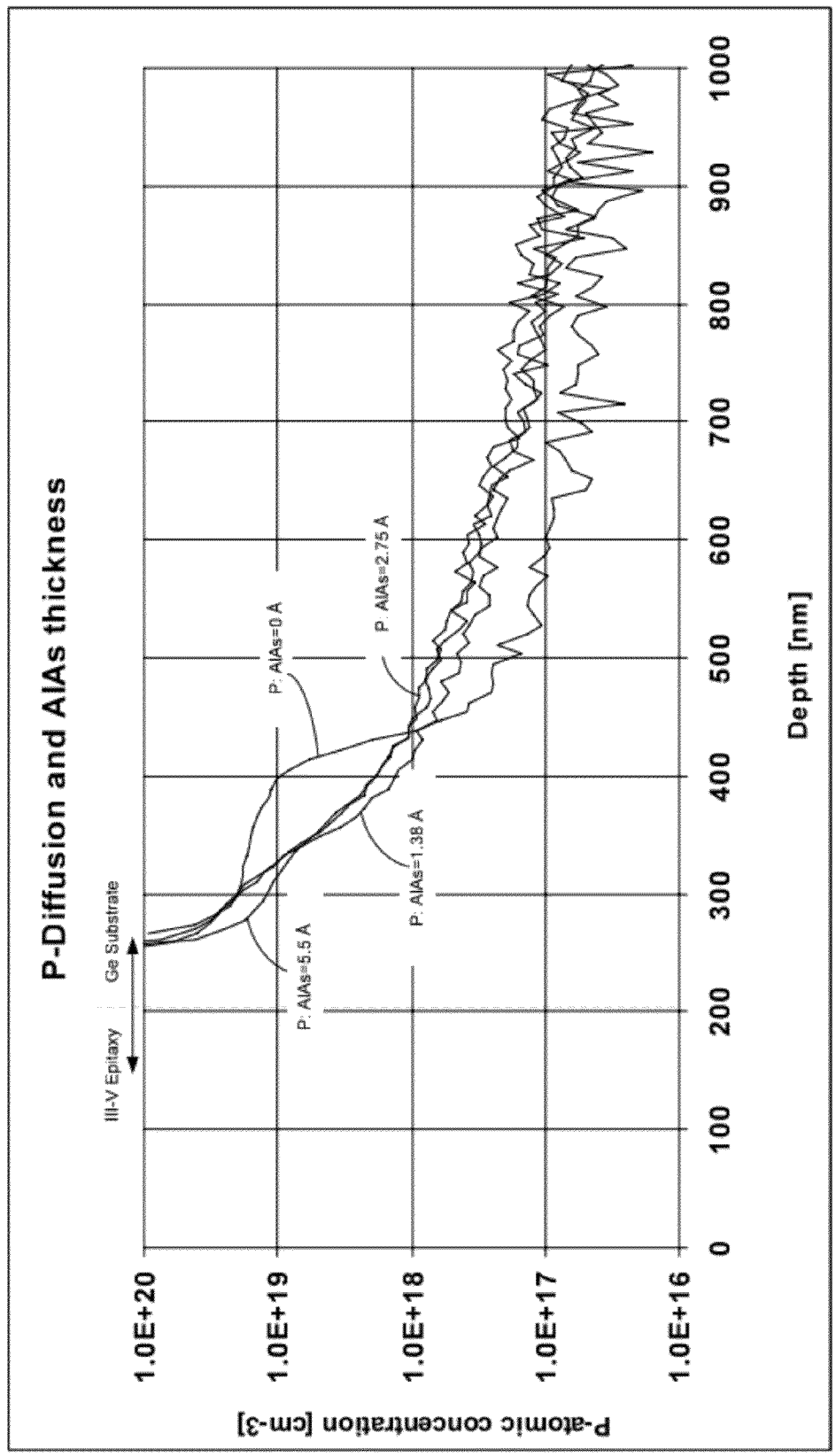
FIG. 11 shows the concentration of Phosphorous as a function sample depth for four different thicknesses of AlAs for the structure of the embodiment of FIG. 1.
Figure 12:
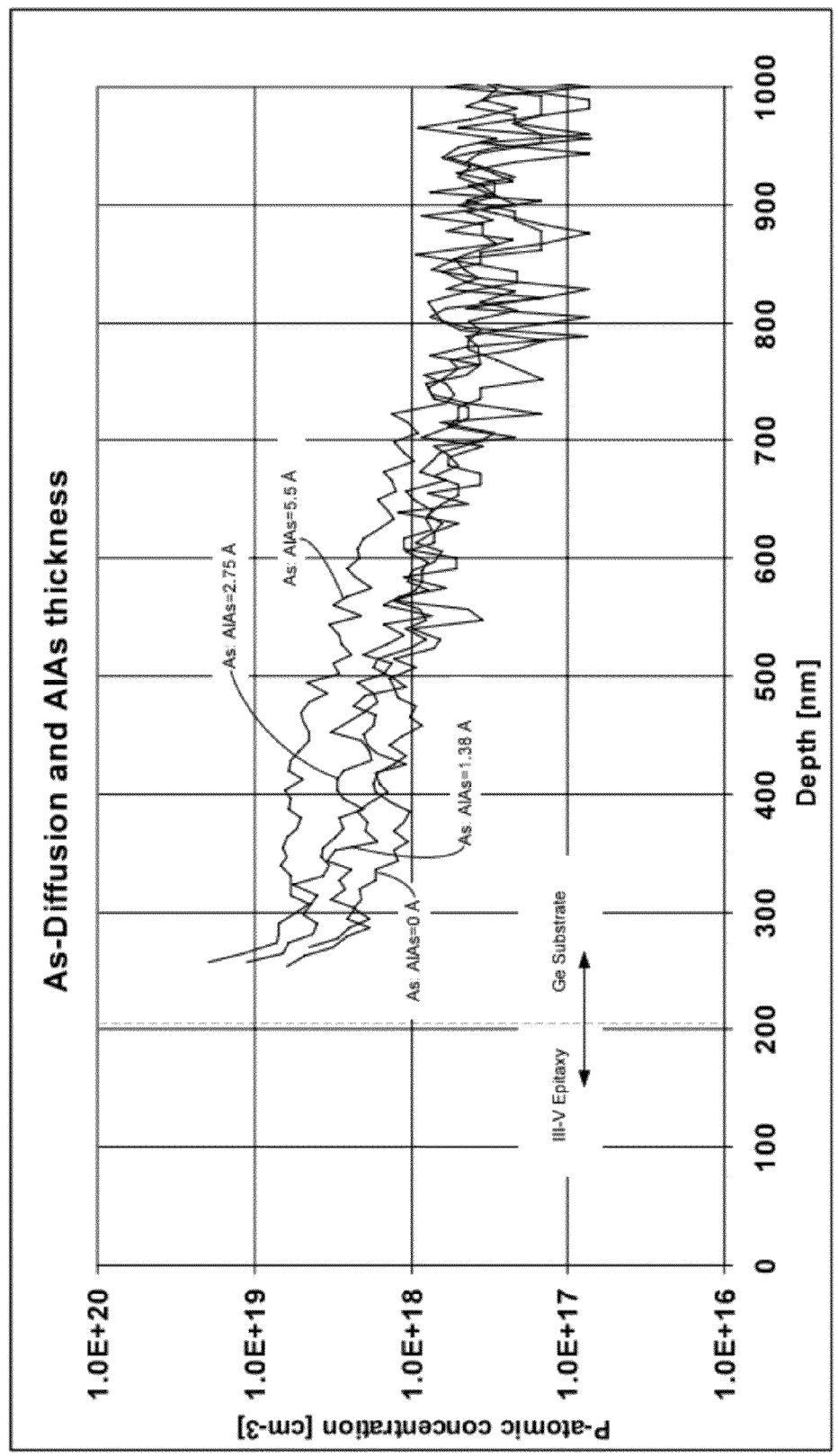
FIG. 12 shows the concentration of Arsenic as a function sample depth for four different thicknesses of AlAs for the structure of the embodiment of FIG. 1.
Figure 13:
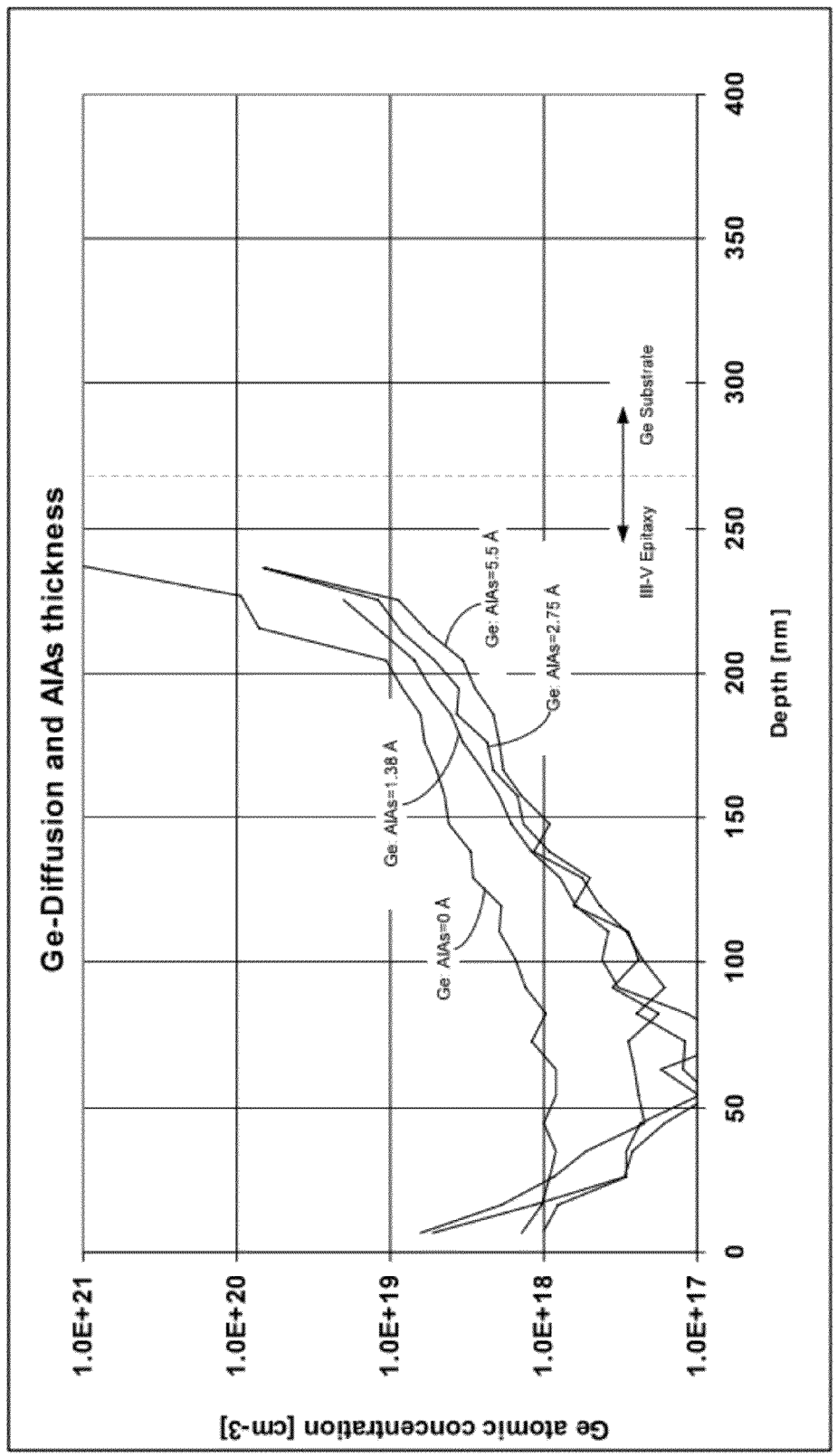
FIG. 13 shows the concentration of Ge as a function sample depth for four different thicknesses of AlAs for the structure of the embodiment of FIG. 1.

FIGS. 8-10 show additional SIMS data taken on structures similar to the structure 18 for four different thicknesses $t_1$ of the AlAs layer 22. FIG. 8 is a P profile showing how much the phosphorous diffusion in the Ge substrate is reduced with a thickness of AlAs of as little as 1.4 Å. FIG. 9 is an As profile showing very little diffusion of As into the Ge substrate. FIG. 10 is a Ge profile showing that the presence of the AlAs layer significantly reduces the outdiffusion of Ge into the bottom part of the III/V layers. Ge typically is an n-type dopant in III/V materials. Enhanced out-diffusion of Ge will prevent the placement of a p-n junction in the Ge substrate, close to the nucleation layer. In such cases the p/n junction may have regions of heavily compensated semiconductors which will result in low minority carrier lifetimes and therefore poor performance, or in regions where the semiconductors bandgaps and the photon absorption is not optimized. Each of FIGS. 8-10 show a trace of AlAs mass profile to identify the location of the III-V/Ge interface for the structure deposited with $t_1=1.1.4$ Å to $t_1=5.6$ Å. In the case of structure 18 deposited with $t_1=0$, there is obviously no Al detected at the interface, but the location of the interface within the structure 18 can be approximated from the 72Ge or 31P profile. FIGS. 11-13 show the same set of data but this time analyzed against material standards which allow the conversion of sputter time to profile depth and count rates to atomic concentrations (corrected for relative abundance of sampled isotopes). As in FIGS. 8-10 they show the effect of the AlAs layer thickness on the atomic concentration of P, Ge and As respectively as a function of sample depth. A vertical stippled line marks the boundary between the III-V layer and the Ge substrate. FIG. 11 shows how the P diffusion into the Ge substrate is reduced with an increase in thickness of the AlAs layer. FIG. 12 shows how the diffusion of As into the Ge substrate can be tailored by choosing an appropriate thickness of the AlAs layer. FIG.

13 shows how the diffusion of Ge into the III-V layer is reduced with an increase in thickness of the AlAs layer. One monolayer of AlAs is sufficient to have the Ge atomic concentration drop to or even below $1 \times 10^{18}$ cm$^{-3}$ within 150 nm (or below $1 \times 10^{17}$ cm$^{-3}$ within 200 nm) from the interface with the Ge substrate. It should be noted that the Ge concentration plot in FIG. 13 increases in value form 50 nm to 0 nm. This is an artifact of the measurement and is due to surface contamination near 0 nm. Also, as FIG. 13 has a logarithmic scale and decreases by an order of magnitude for every major division, the most significant differences are observed for depths between 150 nm and about 225 nm where the concentration is much higher than further away from the Ge/III-V interface. It should also be noted that when the Ge signal becomes low, approaching $10^{17}$ cm$^{-3}$, there is significant noise in the measurement. More precise measurements would be necessary to determine the exact value; however, it can be assumed that the various Ge profiles all continue to decrease at a similar rate when going away from the interface (the diffusion source) and therefore that the order of the curves in the 50-100 nm range should be the same as the order of the curves observed at a depth of about 200 nm.

Figure 14:
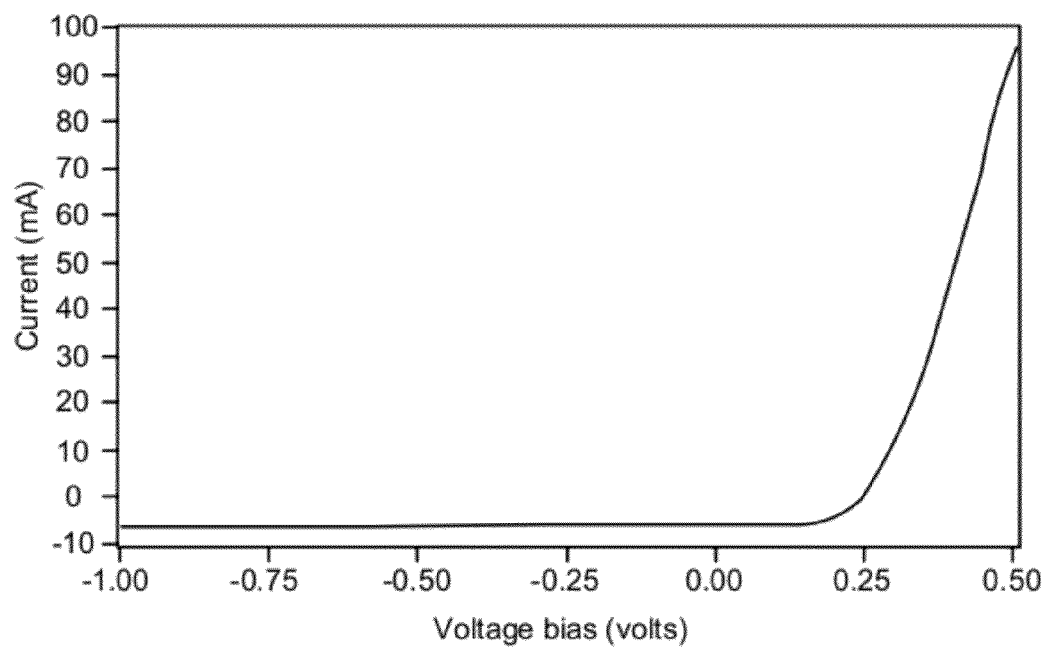
FIG. 14 is a current versus voltage plot of a photovoltaic cell having a structure similar to that shown in the embodiment of FIG. 1.

FIG. 14 shows current plotted as a function of voltage for a solar cell having a structure similar to structure 18 shown at FIG. 1. The solar cell has a p-n junction formed in the Ge substrate 20, an open-circuit voltage ($V_{oc}$) of 0.247 mV, a resistance at $V_{oc}$ of 7.2 ohms, a short circuit current density ($J_{sc}$) of −36 mA/cm$^2$, a series resistance of 2 ohms and a fill factor of 60.5%, the fill factor being a measure of the squareness of the current/voltage plot. These parameters are indicative of a solar cell having a good performance, when taking into account the bandgap of the material used for the solar cells for this example. The Voc is often observed to be at a value of about 0.4V (corresponding to an electron energy of 0.4 eV) lower than the bandgap of the material. As such, the measurement of Voc are consistent with the Ge bandgap of 0.67 eV. The measured fill factor is also consistent with good fill factor values observed by others of Ge cells at 1 Sun.

Figure 15:
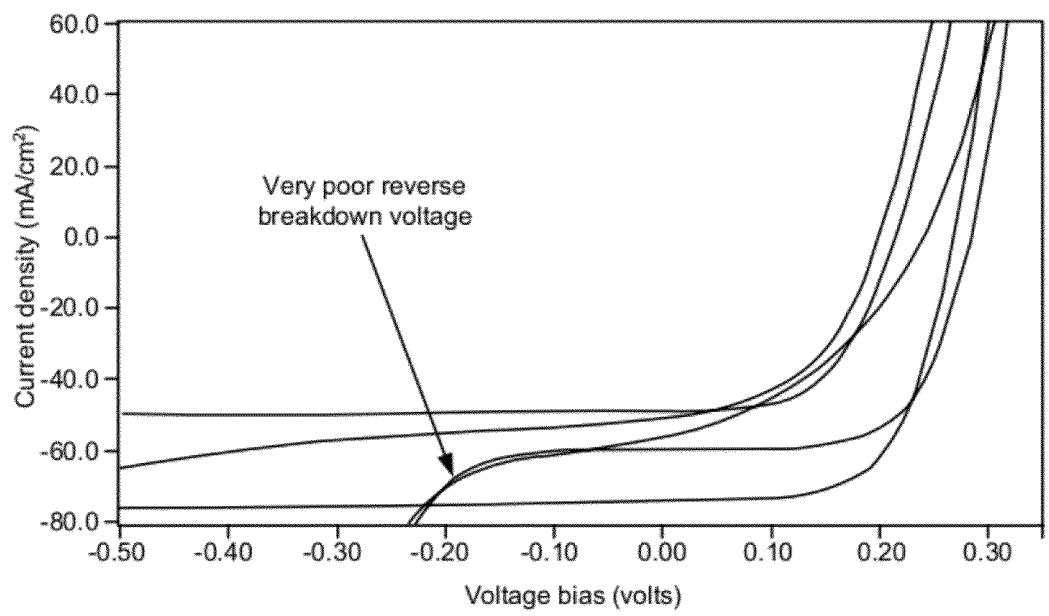
FIG. 15 is a series of current versus voltage plots for photovoltaic cells fabricated without an AlAs nucleation layer and photovoltaic cells fabricated with an AlAs nucleation layer.

FIG. 15 shows a series of plots of current as a function of voltage for Ge solar cells fabricated with and without an AlAs nucleation layer. Two current/voltage plots of solar cells without an AlAs nucleation are indicated by the arrow. For these cells, the $V_{oc}$=280 mV, $J_{sc}$=−36 mA/cm$^2$, the series resistance is 2 ohms and the fill factor is 63%. Indicative also of a good diode performance in forward bias, but, as indicated by the arrow, the reverse breakdown voltage is very poor (approximately −0.2 V). The current/voltage plots of solar cells having an AlAs nucleation layer are the ones not showing a breakdown voltage, demonstrating that the nucleation with the AlAs provides overall superior diode performance. Even more importantly is the smoother morphology obtained in the case when the AlAs nucleation layer is used, as this will typically be critical for the performance of the other active elements to be grown above this p/n junction, as is typically done in, for example, solar cells.

Although the above exemplary embodiments show the growth of III/V structures on Ge substrates, a worker of ordinary skill in the art will readily understand that other types of group IV substrates can be used. Similarly, although a binary AlAs compound was mentioned as a nucleation layer, it is to be understood that ternary or quaternary III/V compounds containing AlAs can also be used as nucleation layers without departing from the scope of this invention. As will be understood by a worker having ordinary skill in the art, the present invention is equally applicable to the fabrication of devices on all types of group IV substrates with or without the inclusion of a p-n junction. Further, as will be understood by the skilled worker, other combinations of III-V compounds could be substituted to AlAs when there is a significant difference in size, or electro-chemical potential for surface binding, between the group III and the group V atoms. Such III-V compounds include, for example, AlN, AlSb, or, BAs, BSb, GaN, GaSb, InN, or InAs.

As will be understood by a worker skilled in the art, although the above description referred to p-type group IV substrates, other types of group IV substrates can be used. Such substrates include n-type, undoped and semi-insulating substrates.

Heterostructures based on pseudomorphic layers, where the epilayers are coherent with the substrate, allow a reduction of defects, which is contrary to metamorphic layers which have a high-density of defects, Higher performance of devices based on such heterostructures is obtained as a consequence of the low defect density. If the device has elastic deformation only, the average in-plane lattice constant of the epilayers (i.e., the average of the nominal in-plane lattice constant of the epilayers) will be substantially the same as the in-plane lattice constant of the substrate. With a low defect count, it is possible to have less dopant and alloy diffusion through active layers in the upper parts of the heterostructure (such an active layer could be, for example, a p-n junction in solar cell heterostructure). This permits to have sharp layer functions such as less compensation, current leakage, or dark currents, and therefore an increased performance It also allows for better reliability after metallization because it minimizes the number of defects sites where metal-semiconductor can interdiffuse and interact.

Figure 16:
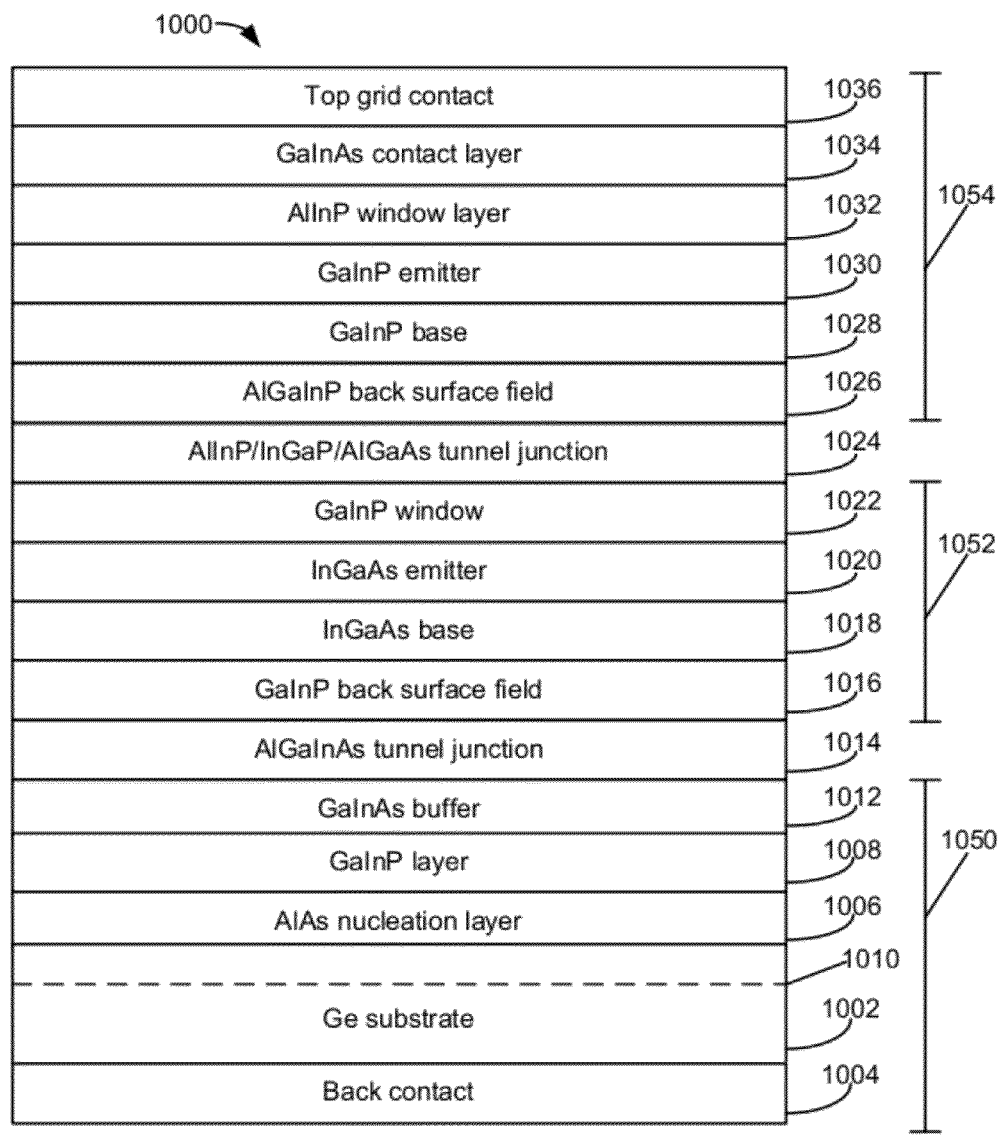
FIG. 16 shows an exemplary layer structure of the three junction solar cell of the present invention.

FIG. 16 shows an example of a three sub-cell solar cell 1000. The solar cell 1000 includes a p-type Ge substrate 1002 which has back contact 1004. The Ge substrate 1002 is a [100]-oriented substrate inclined by about 6° towards the (111) plane. An AlAs nucleation layer 1006 is formed on the Ge substrate 1002. A GaInP layer 1008 is formed on the AlAs layer 1006. Diffusion of phosphorous (P) from the GaInP layer 1008 into the p-type Ge substrate 1002 leads to the formation of a first p-n junction 1010 in the Ge substrate 1002. The average thickness of the AlAs layer can range from 0.5 Å to 50 Å, (about 0.1 layer to about 9 layers of AlAs). A typical thickness can range from 0.5 Å to 5 Å and can preferably comprised between 1 Å and 3 Å.

A GaInAs buffer 1012 is formed on the GaInP layer 1008, followed by an AlGaInAs tunnel junction 1014, a GaInP back surface field layer 1016, an InGaAs base layer 1018, an InGaAs emitter layer 1020, and a GaInP window 1022. The InGaAs base layer 1018 and the InGaAs emitter layer 1020 form a second p-n junction. An AlInP/InGaP/AlGaAs tunnel junction 1024 is formed on the GaInP window 1022.

Above the AlInP/InGaP/AlGaAs tunnel junction 1024 are formed an AlGaInP back surface field layer 1026, a GaInP base layer 1028, a GaInP emitter layer 1030, an AlInP window layer 1032, a GaInAs contact layer 1034, and a top grid contact 1036. A third p-n junction is formed by the GaInP base layer 1028 and the GaInP emitter layer 1030.

The location of the three sub-cells of solar cell 1000 is indicated at reference numerals 1050, 1052, and 1054. Each of the subcells is constructed such as to convert light from pre-determined spectral regions of the Solar spectrum into electricity. Although three sub-cells are shown, the present disclosure encompasses any number of sub-cells. One or more of the subcells can incorporate low-dimensionality structures such as quantum wells, quantum wires, or quantum dots to help bandgap engineer the heterostructure and optimize the conversion efficiency of the device. For example in the case of a three junction solar cell such as shown in the example of FIG. 16, epitaxial quantum dot layers can be included middle cell 1052 to extend its absorption range to longer wavelengths and improve the current-matching of the three subcells.

Figure 17:
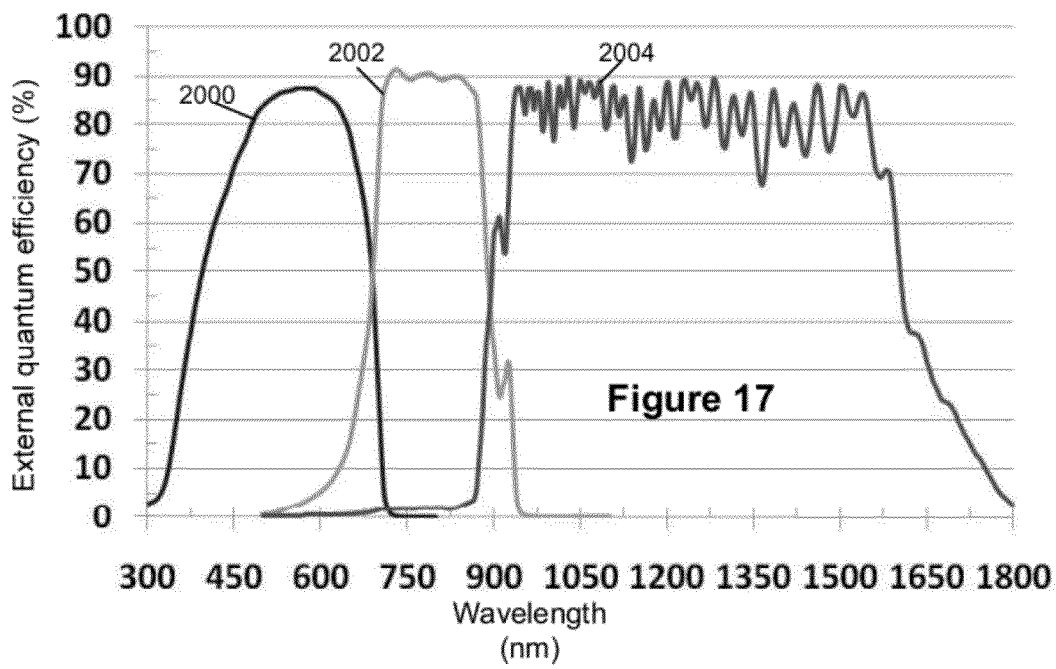
FIG. 17 shows external quantum efficiency plots for each of the sub-cells of the solar cell of FIG. 16.

The sub-cells 1050 (bottom cell), 1052 (middle cell), and 1054 (top cell) of solar cell 1000 can be characterized in a number of ways. One of these ways is by measurement of the external quantum efficiency (EQE) of each of the three sub-cells formed in the solar cell 1000 as a function of the wavelength of the impinging solar light. The EQE is defined as the ratio of the number of electron-hole pairs created by a light beam impinging on a solar cell and collected electrically, to the number of photons in the light beam. As such, for example, an EQE of 90% means that 90% of photons impinging on the solar cell 1000 are converted into electron-hole pairs and collected electrically. FIG. 17 shows a plot of EQE for each of the three sub-cells of the solar 1000 of FIG. 16 as a function of wavelength.

One skilled in the art will recognize that the EQE data of FIG. 17 clearly shows that the main photon loss for a given wavelength is due to the residual reflection at the surface of the device. The short-circuit current (Jsc) of the individual subcells can be estimated by integrating the measured EQE values for the subcell, multiplied by the photon flux in the solar spectrum over the wavelength range of interest. Furthermore, the open circuit (Voc) for each subcell is predominantly determined by the bandgap of the subcell assuming high quality material like in the case if the pseudomorphic devices as prescribed in the present invention using layer 1006-1036 grown atop the Ge substrate 1002. With high EQEs as shown at FIG. 17 with the selected bandgaps of subcells 2000, 2002, 2004 the resulting Jsc and Voc can yield efficiencies of 40% under concentrated illumination for the solar spectrum AM1.5D low AOD, assuming low series resistance in the device and therefore good fill factor (FF) coefficients.

Plots 2000, 2002, and 2004 respectively show the external quantum efficiency of sub-cells 1054, 1052, and 1050. As evidenced by plots 2000, 2002, and 2004, each sub-cell has a maximum external quantum efficiency of about 90%, which is indicative of a low density of structural defects in the sub-cells 1050, 1052, and 1054.

Figure 18:
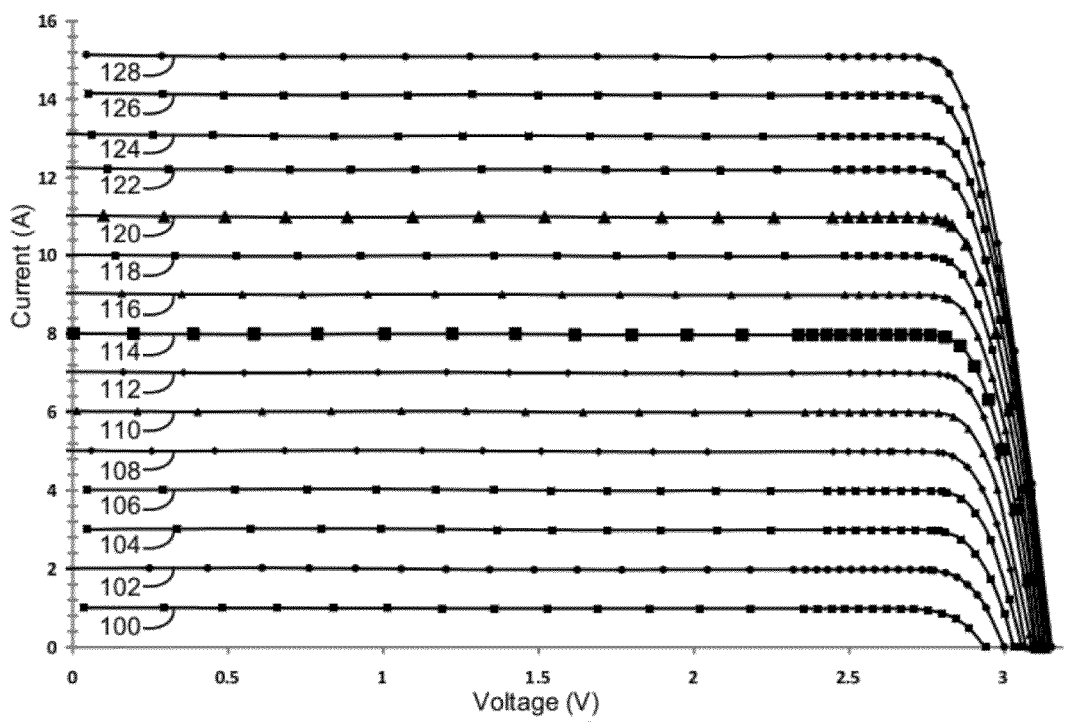
FIG. 18 shows current-voltage plots at different solar concentrations for the solar cell of FIG. 16.

Another way to characterize a solar cell is by measuring its current voltage characteristics under different solar concentrations. FIG. 18 shows plots of current as a function of voltage for the solar cell 1000 of FIG. 16 for fifteen different levels of solar concentration. Table 1 correlates the plot number to the solar light concentration received by the solar cell 1000.

TABLE 1

| Plot No. | Concentration (Suns) |
| --- | --- |
| 100 | 77 |
| 102 | 155 |
| 104 | 232 |
| 106 | 310 |
| 108 | 388 |
| 110 | 468 |
| 112 | 544 |
| 114 | 619 |
| 116 | 698 |
| 118 | 774 |
| 120 | 852 |
| 122 | 946 |
| 124 | 1012 |
| 126 | 1093 |
| 128 | 1169 |

The plots 100-128 show excellent I-V characteristics, which are attributable to, with reference to FIG. 16, the high quality layers 1006-1036 grown atop the Ge substrate 1002.

Figure 19:
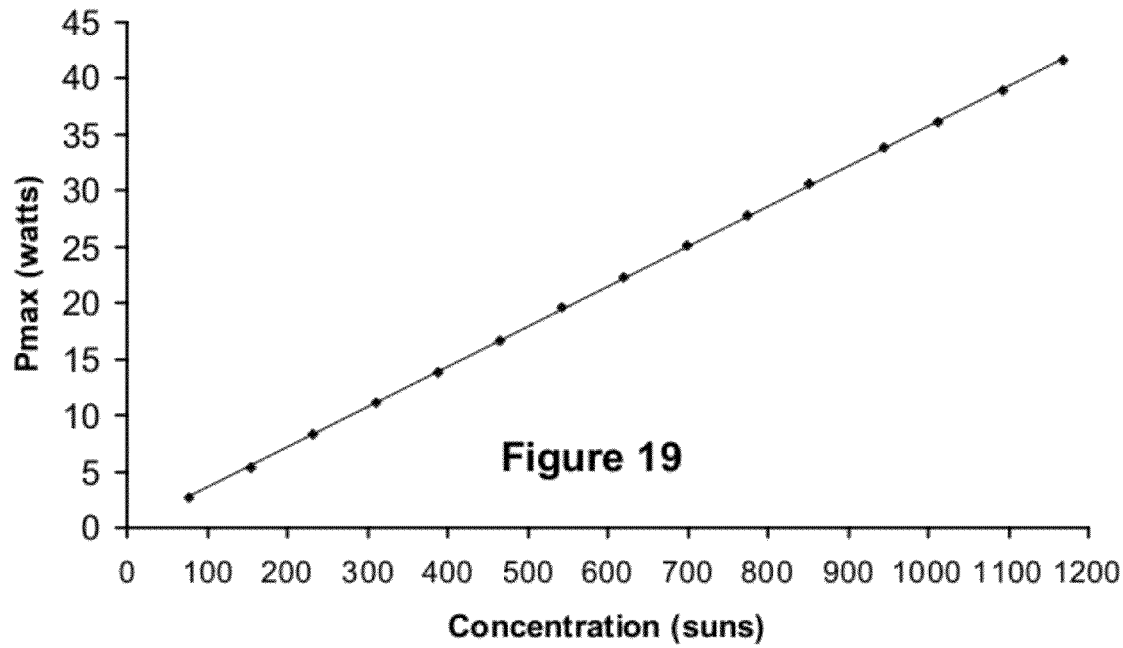
FIG. 19 shows a plot of maximum power as a function of solar concentration for the solar cell of FIG. 16.

FIG. 19 shows a plot of maximum power as a function of solar concentration for solar cell 1000.

Figure 20:
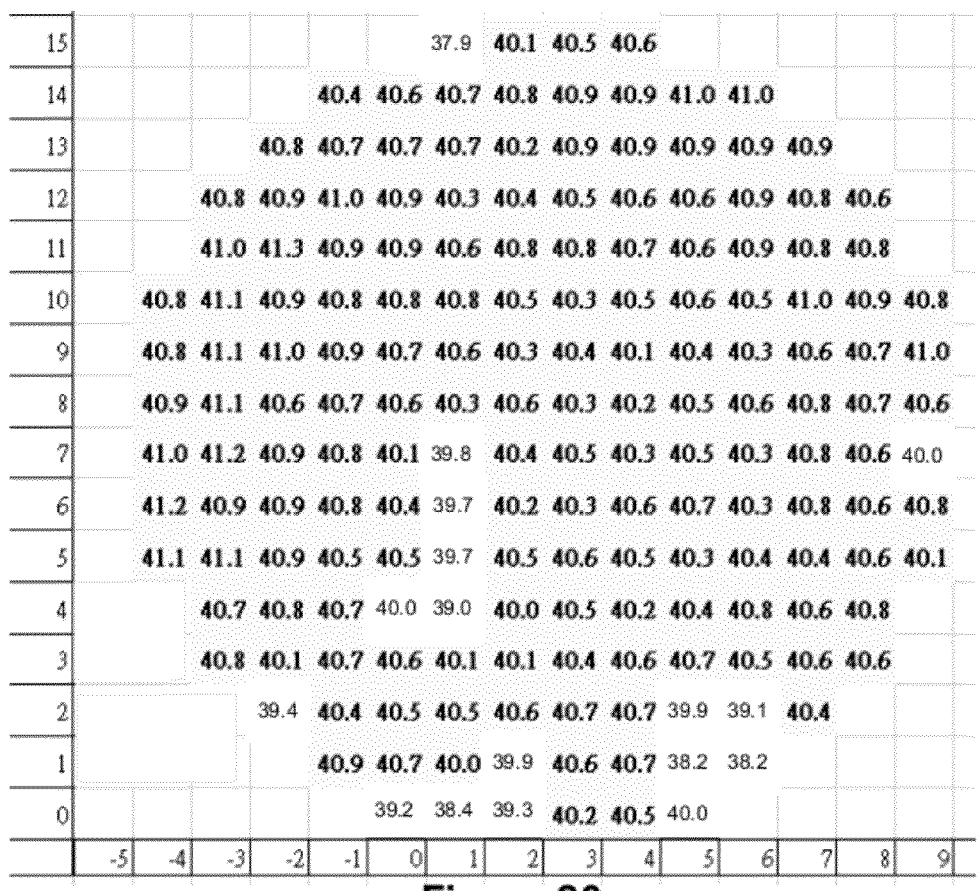
FIG. 20 shows a two-dimensional map of efficiencies for a plurality of solar cells similar to that of FIG. 16, as a function of their position on a wafer.

FIG. 20 shows a two-dimensional view of a four inch wafer having a plurality of solar cells formed thereon. Each solar cell is labeled with its measured efficiency. The relatively high efficiency values of each solar cell are indicative of the high quality layers 1006-1036 grown atop the Ge substrate 1002.

Figure 21:
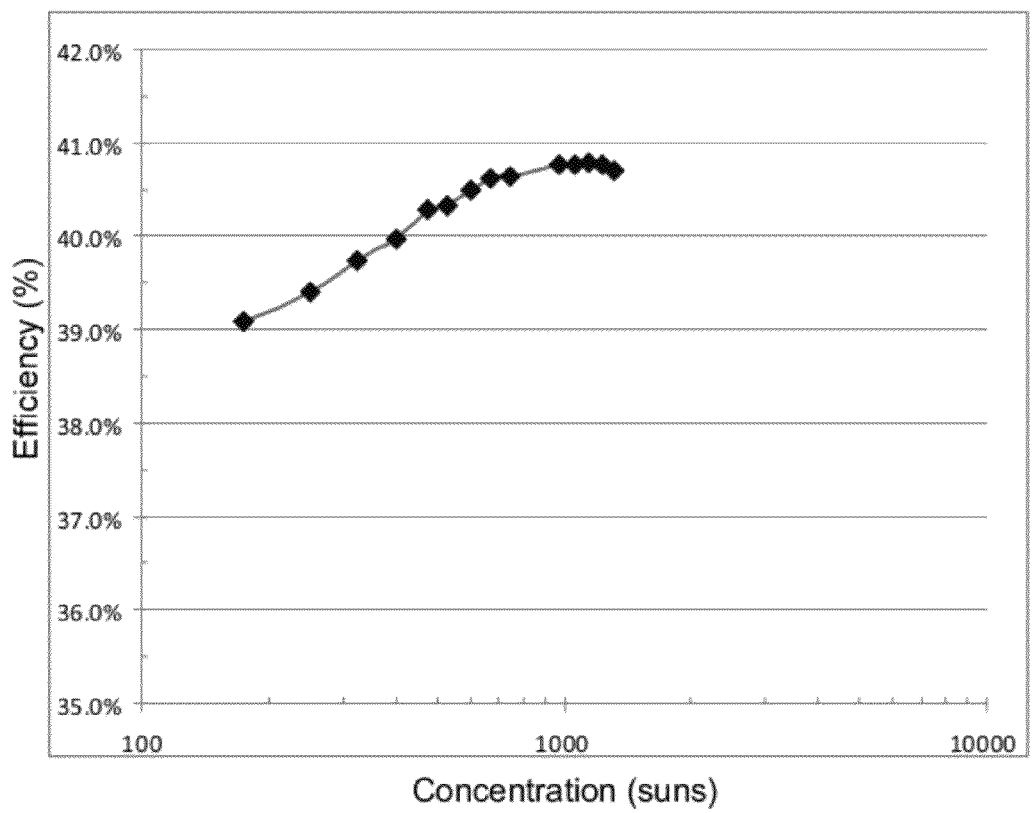
FIG. 21 shows a plot of efficiency as a function of solar concentration for the solar cell of FIG. 16.

FIG. 21 is a plot of efficiency as a function of solar concentration for solar cell 1000. From FIG. 21, it is clear that high performance is maintained at high concentrations. A prerequisite for a low roll-off of the efficiency at high concentrations is that the series resistance of the devices is very low (<~10 milliohms for FIG. 21). This requires optimized doping throughout the structure which are best obtained when the density of the defects is kept low and with high quality semiconductor materials like in the case of layers 1006-1036 grown atop the Ge substrate 1002.

For high performance multi junction solar cells operating under high illumination conditions, such as is the case for concentrated photovoltaic (CPV) application typically exposed to several hundred times the usual sun intensity (e.g., often between 500 Suns and 1000 Suns), the internal parasitic resistance of the multijunction solar cell should be minimal (for example, as low as 1 mohm). As will be understood by the skilled worker, valence and/or conduction band edge discontinuities of the semiconductor materials making up the solar cell can lead to movement restriction of the charge carriers (electrons and holes) within the heterostructure, which can lead to higher electrical resistance. Therefore, it is important to optimize the design, process, and material choice of the multijunction solar cell to control such movement restriction of the charge carriers in order to minimize the aforementioned resistance.

The semiconductor heterostructure design of a multijunction solar cell such as the one depicted in the example of FIG. 16 has several band-offset and discontinuities due to the different III-V and group IV semiconductor alloys and the doping profiles typically used to optimized the device performance. FIG. 22 depicts the modeled bandgap and band edge profiles for the conduction band 3300 and valence band 3400 of a structure similar to the one depicted in FIG. 16. The band alignment of the different semiconductor depends on the intrinsic material properties such as the work function of the semiconductor, and can also depend on other extrinsic factor such as the doping level used, the interface properties, interface states, etc. FIG. 22 is described in greater details below.

As described elsewhere in the disclosure, the nucleation designs and processes described are to allow better control over the diffusion properties of the group III and group V atoms within the underlying group IV layer, as well as allowing a high quality pseudomorphic growth which can be substantially free of anti-phase domain defects. This allows forming a high performance subcell from the diffusion of the group III and group V atoms to form the emitter within the group IV material, and it allows forming high performance upper subcells due to the low defect density of the upper layers grown by epitaxy, on the group IV layer (be it a group IV substrate or a group IV epitaxially grown layer).

As shown in FIG. 3, and as described elsewhere in the disclosure, a very thin nucleation layer of III-V binary material such as AlAs is very effective in providing a three layer structure that is substantially free of anti-phase domain defects (see three layer structure of FIG. 1. For example, we have shown that only a few monolayers, or even a fraction of a monolayer, of AlAs is sufficient to substantially eliminate anti-phase domain defects. Therefore, the degree of freedom in the thickness of the AlAs layer allows a better control in the optimization of other important aspect of the device properties, such as the diffusion of alloys or dopants which are important to control the bandedge discontinuities and the series resistance of the multi junction device or other similar device. For example, for certain applications, a thicker AlAs layer could be used to better suppress the diffusion of the group IV atoms into the III-V layers and of the group III and/or group V atoms into the group IV layer. As shown in FIG. 3, the thicker the AlAs layer can provide a good morphology (low defect count) for pseudomorphic layers to grown by epitaxy on top of the layers of FIG. 3. Alternatively, for other applications, a thin AlAs layer could be used and still provide for a good morphology of pseudomorphic layers grown by epitaxy atop the layers of FIG. 3, but in this case, the thin AlAs layer would allow for more diffusion of group IV and group III and/or group V atoms near the nucleation layer interface.

As an example, FIG. 22, which is described in more details further below, shows the modeled band structure for an n-type Ge/GaInP/Ga(In)As layer stack in which case there is no AlAs nucleation layer present between the Ge and the GaInP, the GaInP grown atop the Ge, to control the anti-phase domain defects in the GaInP and Ga(In)As or the diffusion properties of group III and group V atoms at the GaInP/Ge interface. In such case the majority carriers, such as the electrons in the emitter layers, which normally go, in the example of FIG. 22, from the right to the left in the conduction band of the corresponding solar cell structure, flow without being significantly impeded by band-discontinuities. The minority carriers in the Ge emitter, the holes, which must normally go toward the right in the valence band of the corresponding of the solar cell structure, do flow without being significantly impeded by band-discontinuities toward the right. If the minority holes in the Ge are initially propagating toward the left they will get reflected on the large valence band discontinuity at the GaInP/Ge interface and will go back toward the right toward the p/n junction as desired for high-performance solar cells.

By adding an AlAs nucleation on top of the Ge layer, the band diagram show in FIG. 22 is changed due to the bandgap of AlAs and band offset of the AlAs with respect to Ge and GaInP. The AlAs layer can be used to change the diffusivity of the III-V species in the Ge. Furthermore, by adjusting the thermal budget (heat applied) of the subsequent layer overgrowth and/or the thickness of the AlAs and of the GaInP it is possible also to better control the diffusion profile of group III atoms and group V atoms and therefore to optimize the device performance. The thermal budget applied to the nucleation AlAs layer or to the GaInP second layer, can be changed by controlling the temperature and the time used to grow the overlayers forming the rest of the heterostructure, and/or by using additional annealing of the heterostructure while the epiwafers are still in the epitaxy reactor. Alternatively, post-growth annealing using ovens such as Rapid Thermal Annealing (RTA) ovens can be used.

Figures 23A, 23B:
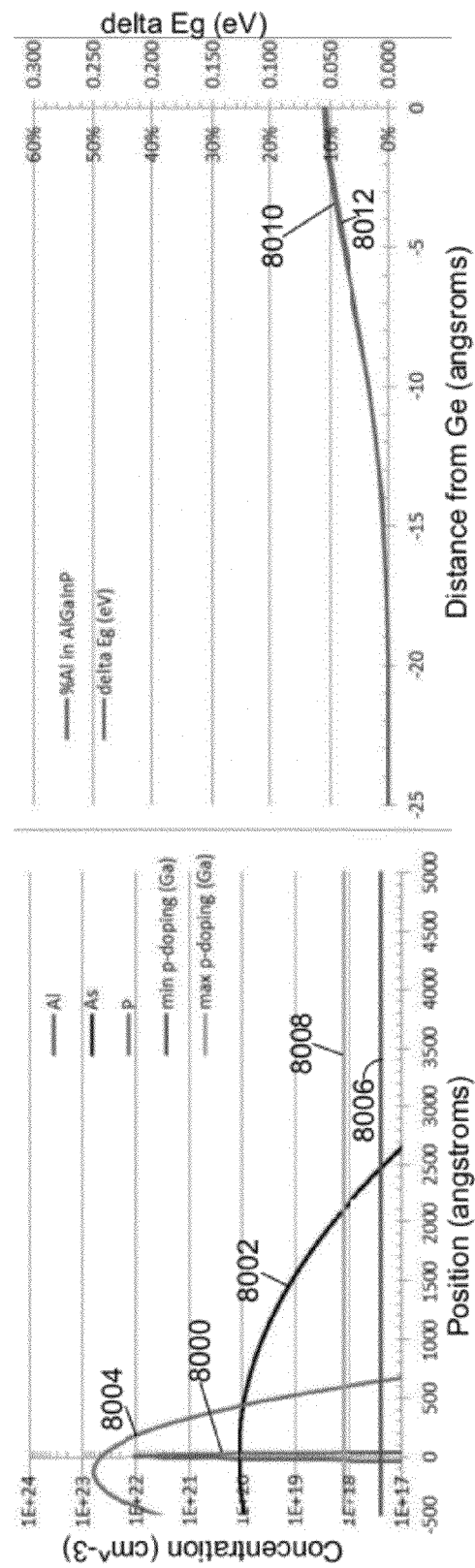
FIG. 23A shows a first example of simulated diffusion profiles for the Al, As and P at a Ge/GaInP interface.
FIG. 23B shows a plot of the Al composition and calculated bandgap offset in relation to the simulated diffusion profiles of FIG. 23A.

For example, the concentration ($cm^{-3}$) vs position (Angstrom) plots of FIG. 23A shows the simulated diffusion profiles for the Al (8000), As (8002), P (8004) atoms using a Fickian diffusion model. The originally p-type Ge is on the positive side of the x-axis and, for reference purposes, the FIG. 23A also shows an example of minimum (8006) and a maximum (8008) p-type doping levels in the Ge obtained using Ga dopants in the preparation of the Ge substrate. A 0.2 nm thick AlAs is adjacent to the left of zero on the x-axis, and a 25 nm thick GaInP is to the left of the AlAs layer (in negative x-value region). To account for the different diffusivity of the different atoms, a relative diffusivity coefficient is used to model the composition profile for a given diffusion length. For this example, relative diffusivity coefficients of P/Al, As/Al, and As/P of 20, 100, 5 were used respectively. FIG. 23B shows a plot of the Aluminum composition 8010 (percentage on left side of the vertical scale) of the resulting AlGaInP quaternary alloy within the III-V layer on top of the Ge substrate resulting from the Al diffusion from the AlAs nucleation layer into the adjacent GaInP second layer, as well as the calculated bandgap offset (8012) in eV on the right side of the vertical scale. Whereas the band offset due to the AlAs layer without diffusion can be several hundred of meV, the modeled diffusion profile demonstrate that the band offset can be reduced to about 50 meV for the conditions used in the example of FIG. 23B. As mentioned above, if there are significant band discontinuities in the conduction band in that region of the heterostructure, the electron transport can be restricted which can lead to undesired series resistance and therefore reduced performance. Therefore by controlling the thermal budget and the thicknesses of the layers, the present disclosure allows to better control not only the morphology of the overgrown pseudomorphic layers but also the gives an independent control on the relative diffusivity of the various atoms, and also allows the optimization and the engineering of the band discontinuities.

Figures 25A, 25B:
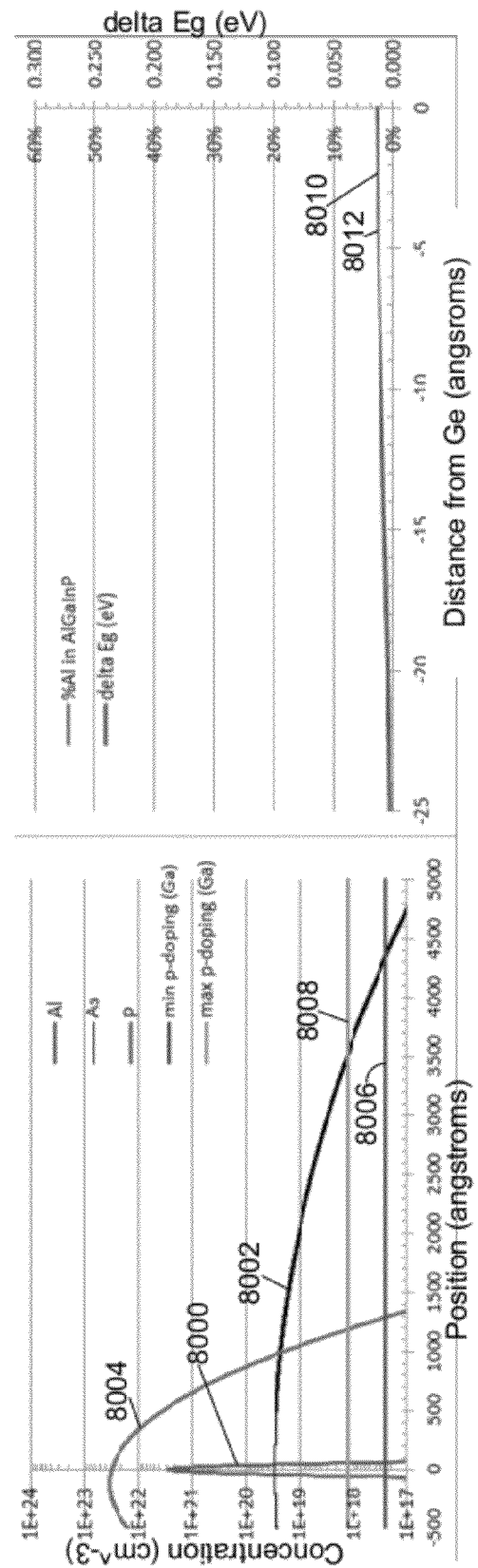
FIG. 25A shows a first example of simulated diffusion profiles for the Al, As and P at a Ge/GaInP interface.
FIG. 25B shows a plot of the Al composition and calculated bandgap offset in relation to the simulated diffusion profiles of FIG. 25A.

As another example, FIGS. 24A and 24B show a case similar to that of FIGS. 23A and 23B, but where the diffusion length is simulated to be doubled from an increased thermal budget. Whereas the peak Al concentration in the resulting AlGaInP alloy was slightly over 10% in FIG. 23B, it is now reduced by half and therefore will result in a small bandgap offset, which is comparable to the thermal energy available at room temperature. When no band offset or only small band offsets are present, the thermal energy available at the operating temperature normally allow high device performance with low internal series resistance for CPV applications at high concentration. Similarly, FIGS. 25A and 25B show a case where this time the thickness of the AlAs layer is reduced by half to further reduce the Al concentration in the resulting AlGaInP alloy. This change can also be used to vary the diffused As concentration in the Ge emitter, as mentioned elsewhere in the present disclosure.

As can be seen from the above examples (for example the combined P and As diffused profiles), and from the measured diffusion profiles of FIGS. 11 and 12, the choice of the alloy used for the nucleation layer and the design of the nucleation layer (such as its thickness for example) can be used to change the diffusivity of the III-V species into the group IV substrate. Such an independent control on the relative diffusivity of the various atoms can be engineered to tailor a better optimized emitter profile in the group IV region. Due to the different relative diffusivities of at least 2 different group V atoms of such an emitter configuration, this emitter will consequently consists of a first portion which is closer to the III-V/IV interface and which has a higher doping level comprised predominantly of the group V atoms originating from a first layer grown adjacent to the nucleation layer and which can be maintained relatively narrow, and of a second portion which is adjacent to the interface of the nip junction in the group IV substrate and which has a lower doping level comprised predominantly of the group V atoms originating from the nucleating layer. As such, a multi-junction solar cell of the present disclosure comprises a group IV layer having a surface defined by a plane. The plane contains group IV elements spaced-apart by a group IV layer in-plane lattice parameter. The group IV layer has a p-n junction formed therein. The solar cell also comprises a nucleation layer formed on the surface of the group IV layer. The nucleation layer has a nucleation layer thickness The nucleation layer includes a III-V compound that has at least aluminum (Al) as a group III element and at least one of arsenic (As), nitrogen (N) and antimony (Sb) as a group V element. The solar cell further comprises at least one additional layer that contains a III-V compound. The at least one additional layer is formed on the het-nucleation layer. The at least one additional layer has, in a direction substantially parallel to the plane of the group IV layer, a lattice parameter substantially equal to the group IV layer in-plane lattice parameter. The p-n junction has a p-doped base and an n-doped emitter. The n-doped emitter is defined by at least two n-type dopants, each n-type dopant having associated thereto a respective concentration that varies as a function of distance from the group IV surface. One of the n-type dopants is a group V element, from the at least one additional layer, that has diffused from the at least one additional layer into the group IV layer. Another of the n-type dopants is a group V element, from the nucleation layer, that has diffused from the nucleation layer into the group IV layer.

Figure 25C:
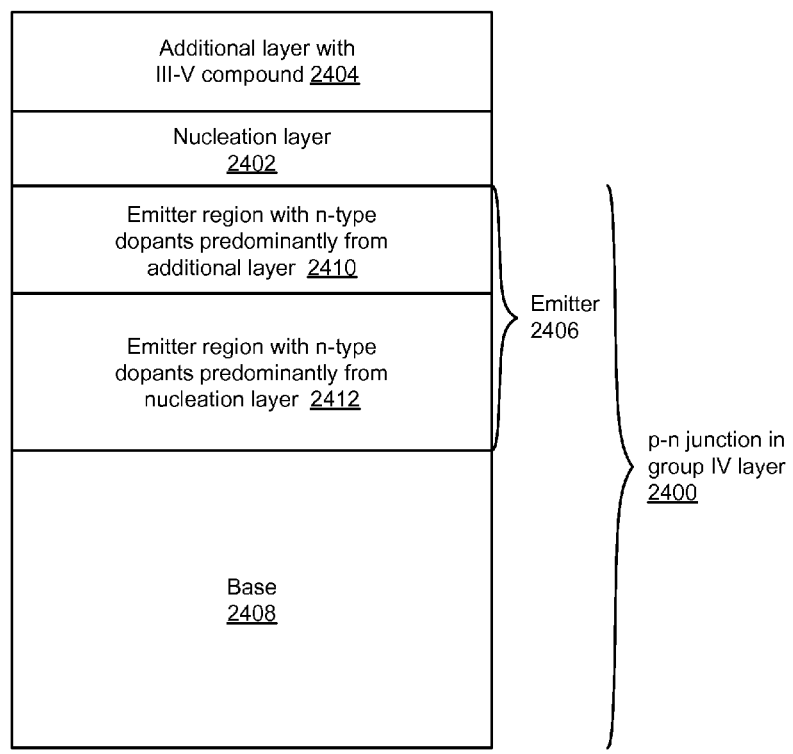
FIG. 25C shows a p-n junction formed in a group IV layer, the p-n junction has a nucleation layer and an additional III-V compound layer formed thereon.

FIG. 25C shows an example of p-n junction formed in a group IV layer 2400 atop of which are formed a nucleation layer 2402 and an additional layer that contains a III-V compound. The p-n junction 2400 has a base 2408 and an emitter 2406. The emitter has a first portion 2410 that comprises n-type dopants having diffused from the additional layer that contains a III-V compound. The emitter also has a second portion 2412 that comprises n-type dopants diffused predominantly from the nucleation layer 2402.

As can also be understood from the above examples and in view of the valence or conduction bands discontinuities related to the different semiconductors, one potential contributor to series resistance is the AlAs nucleation layer (1006 in FIG. 16), if the AlAs layer thickness and the thermal budget are not optimized for such heterostructures or processes.

Because of the relatively large bandgap of AlAs relative to that of the other semiconductor constituents in the multijunction solar cells described herein, it is therefore important that the thickness of the AlAs nucleation layer not be to large. The other binary nucleation layers discussed in the present disclosure have different energy bandgaps or different lattice constants. Therefore the valence or conduction band discontinuities, or the lattice constant, or the choice of group III atom, or the choice of group IV atom, are considerations which must be evaluated when choosing the optimum nucleation layer from the group listed in the present disclosure. The AlAs is the one that offer the closest to being lattice-matched from this group in the case of a Ge substrate. For example, the InAs is the one with the smallest bandgap. Because the InAs bandgap is smaller than the bandgap of Ge, it could create other kind of band discontinuities such as a potential well if a relatively thick layer is used. But the InAs also has a large lattice-mismatch compared to Germanium, therefore to keep the epitaxy pseudomorphic, it is also preferable to keep the thickness around 1 monolayer or smaller, in which case it is not expected that any potential well would be created. As another example, GaSb has a bandgap similar to Ge, or the composition of the ternary AlGaSb can be adjusted by adding a small fraction of Al to adjust the bandgap to optimize the band alignment and/or the window properties that the nucleation layer has for the subcell formed in the Ge base layer.

A detailed description of FIG. 22 follows. FIG. 22 illustrates an example of a modeled bandgap energy diagram for a multijunction solar cell having 3 subcells. In the graph of FIG. 22, the ordinate represent the bandgap energy (eV) and the abscissa represent depth (in micrometers) from the input surface of the multijunction solar cell. That is, the graph of FIG. 22 shows the conduction band 3300 and the valence band 3400 energy as a function of the distance from the top surface 3000 of the heterostructure 3600, the heterostructure being the multijunction solar cell, which is similar to the one shown at FIG. 16. For this exemplary embodiment, a first subcell 3500, which is often called a top subcell (or top cell (TC)), is placed (formed, disposed) in the topmost layers of the heterostructure 3600. As such, the TC is closest to the surface receiving sunlight. A second subcell 3502, which is often called a middle subcell (or middle cell (MC)), is placed below the TC. A third subcell 3504, which is often called a bottom subcell (or bottom cell (BC))), is placed below the MC and often grown by epitaxy on the top surface of a substrate (not shown). The substrate would typically be to the rightmost side of graph of FIG. 22, or would be part of p-layer of the BC (layer 3040).

Each subcell (TC, MC, BC) typically comprises a p/n junction with a depletion region formed at the junction between a p-doped region and an n-doped region within each subcell. The p/n junction 3100 of the TC 3500 is between its p-doped base layer 3008 and its n-doped emitter layer 3006. The p/n junction 3102 of the MC 3502 is between its p-doped base layer 3020 and its n-doped emitter layer 3018. The p/n junction 3104 of the BC 3504 is between its p-doped base layer 3040 and its n-doped emitter layer 3038. The base of any of the subcells can comprise multiple sections with different thicknesses and doping profiles such as illustrated, for example, with the two base layers of the MC 3502, the two base layers being a first base layer 3022 with, in this case, more p-type doping than the adjacent second base layer 3020. Such layer arrangement can be used for example to create a so called p-n or p-i-n configuration to optimize certain aspects of the optoelectronic properties of the device.

Each subcell (TC, MC, BC) can comprise a window layer typically formed adjacent to the emitter layer of the subcell in question. The window layer can comprise a number of layers with different values of doping and bandgap energies to optimize the optoelectronic properties of the solar cell. The window layers 3004, 3002, and 3000 of the TC 3500 are adjacent to, and in electrical contact with, its n-doped emitter layer 3006. The window layers 3016 and 3014 of the MC 3502 are adjacent to, and in electrical contact with, its n-doped emitter layer 3018. The window layers 3036 and 3034 of the BC 3504 are adjacent to, and in electrical contact with, its n-doped emitter layer 3038. These window layers can also play other functions in the device to improve the crystal quality, to optimize the optoelectronic properties, and/or to transition the growth process from one section of layers to another. For example the BC window layer 3034 can also be a buffer layer during the epitaxy of the first section of the heterostructure, or the MC window layer 3016 can also be part of the tunnel junction cladding connecting the MC 3502 to the TC 3500.

As mentioned elsewhere in the present disclosure, one of the window layers 3036 or 3034 of the BC 3504 can be formed at the interface 3200 between a substrate layer and the epitaxially layers grown above it. Then the BC window layer 3036 would also have the function of being a nucleation layer. Therefore the crystal quality of the semiconductor nucleation layers can directly affect the function and properties of the window layer 3036 and of the epitaxial layers above. As also mentioned elsewhere in the present disclosure, it can therefore be advantageous to add other nucleation layers such as AlAs at the substrate/epilayer interface 3200, as described further below, for example in FIG. 23, 24, or 25. For clarity, in such cases the nucleation layer(s), such as an AlAs layer for example, would be introduced between the BC layer 3038 and the BC window layer 3036 shown in FIG. 22, and therefore the band diagram shown in FIG. 22 would have to be modified according to the properties of the nucleation layer(s). These nucleation layers then become part of the BC window layer group.

Each subcell can comprise a back-surface-field layer (BSF) adjacent to the a respective base layer furthest away from the p/n junction. The BSF layers can comprise a number of layers with different values of doping and bandgap to optimize the optoelectronic properties of the device. The BSF layer 3010, 3012 of the TC 3500 are adjacent to, and in electrical contact with, its p-doped base layer 3008. The BSF layer 3024 of the MC 3502 are adjacent to, and in electrical contact with, its p-doped base layer 3022. The BSF layers of the BC 3504 is not shown in FIG. 22 but would typically be adjacent to, and in electrical contact with, its p-doped base layer 3040. The base 3040 of the BC can typically also be made thicker than depicted in FIG. 22.

The MC 3502 can be epitaxially grown adjacent to, and in electrical contact with, the BC 3504 by using tunnel junction (TJ) 3108, which comprises various layers with different doping profiles and thicknesses shown at layers 3030, 3028, and 3026 in FIG. 22. The TC 3500 can be epitaxially grown adjacent to, and in electrical contact with, the MC 3502 by using tunnel junction (TJ) 3106, which comprises various layers with different doping profiles and thicknesses shown at layers 3016, 3014, and 3012 in FIG. 22.

Whereas FIG. 22 shows, for illustration purposes, an n on p configuration, it will be understood by one skilled in the art that either an n on p (also sometimes denoted as n-p or n/p) or p on n (also sometimes denoted as p-n or p/n) configuration can be used without departing from the scope of the present disclosure. Alternatively a p-i-n or an n-i-p configuration can be used or combined with the other configurations for the various subcells.

Band diagram modeling such as the one depicted in FIG. 22 for a 0V external bias, can be useful to simulate the optoelectronic properties of the heterostructure for the device (solar cell) of interest. It therefore can be used to optimize the design of such multijunction devices, and it can be repeated for various conditions of external voltage biases, for different illumination conditions, and/or for different device temperatures. The band diagram modeling typically takes into account the Fermi level adjustments between the various layers based on their doping profiles, as well as the band offsets between the various layers depending on such intrinsic factors such as the work function of the semiconductors. It can also take into account the coulomb interactions between charged carriers arising from the photo-generation of carriers, or carriers obtained by doping during the epitaxial process or post-growth using implantation processes. It can also model the minority and the majority carrier lifetimes and transport through the heterostructure, the quantization energies of the carriers, the radiative and non-radiative recombination mechanisms of the different carriers, it can use self-consistent Poisson-Schrodinger approach, it can be based on 1-dimensional modeling as depicted in FIG. 22, or on more complex 2 or 3 dimensional modeling.

For semiconductor epilayers having a thickness comprised between ~1 μm to ~10 μm, pseudomorphic growth can be achieved by having the nominal lattice constant of the material being grown close to the lattice constant of the underlying substrate. For example, FIG. 26 shows a plot 7004 of the lattice constant vs composition (fraction 'x' of aluminum) for AlGaAs (which can be noted $Al_xGa_{1-x}As$). Upper boundary 7008 and lower boundary 7010 indicate a lattice constant mismatch tolerance around the lattice constant of Ge, which is shown at 7000. The upper and lower boundaries 7008 and 7010 will vary depending on the desired thickness of the pseudomorphic layer being grown, and on how much residual strain can be supported by the pseudomorphic layer. The three arrows 8000, 8002, and 8004 respectively show the minimum, optimal, and maximum composition of the ternary alloy which can be used to satisfy those strain conditions, i.e., which has a lattice parameter comprised between the boundaries 7010 and 7008. Based on FIG. 26, the lattice matched composition of $Al_xGa_{1-x}As$ is about 63%, the minimum composition is about 40%, and the maximum composition is 86%. Also shown in FIG. 27 are the lattice constant of AlAs at 7002 and of GaAs at 7006.

In another example, FIG. 27 shows a plot 7012 of the lattice constant vs composition (fraction 'x' of indium) for InGaP (which can be noted $In_xGa_{1-x}P$). As in FIG. 26, upper boundary 7008 and lower boundary 7010 indicate a lattice constant mismatch tolerance around the lattice constant of Ge, which is shown at 7000. The upper and lower boundaries 7008 and 7010 will vary depending on the desired thickness of the pseudomorphic layer being grown, and on how much residual strain can be supported by the pseudomorphic layer. The three arrows 8006, 8008, and 8010 respectively show the minimum, optimal, and maximum composition of the ternary alloy which can be used to satisfy those strain conditions, i.e., which has a lattice parameter comprised between the boundaries 7010 and 7008. Based on FIG. 27, the lattice matched composition of $In_xGa_{1-x}P$ is about 49.4%, the minimum composition is about 49%, and the maximum composition is 49.8%. Also shown in FIG. 27 are the lattice constant of AlAs at 7002 and of GaAs at 7006.

Figure 28:
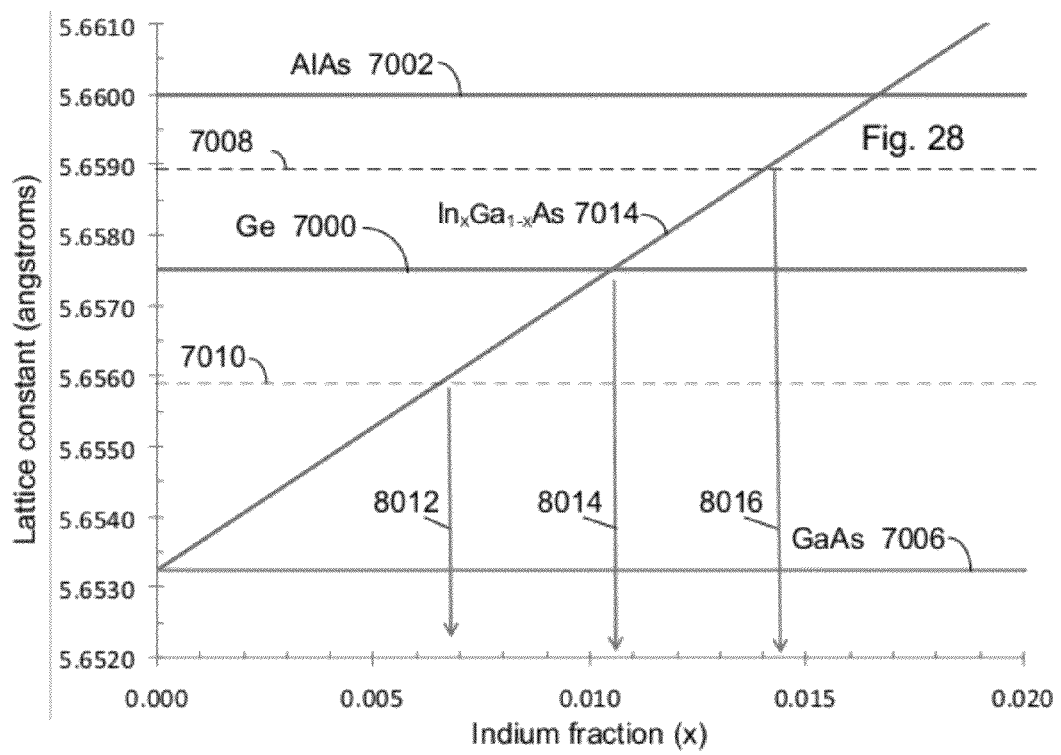
FIG. 28 shows a plot of the lattice constant of $In_xGa_{1-x}As$ as a function of Indium fraction.

In yet another example, FIG. 28 shows a plot 7014 of the lattice constant vs composition (fraction 'x' of indium) for InGaAs (which can be noted $In_xGa_{1-x}As$). As in FIGS. 26 and 27, upper boundary 7008 and lower boundary 7010 indicate a lattice constant mismatch tolerance around the lattice constant of Ge, which is shown at 7000. The upper and lower boundaries 7008 and 7010 will vary depending on the desired thickness of the pseudomorphic layer being grown, and on how much residual strain can be supported by the pseudomorphic layer. The three arrows 8012, 8014, and 8016 respectively show the minimum, optimal, and maximum composition of the ternary alloy which can be used to satisfy those strain conditions, i.e., which has a lattice parameter comprised between the boundaries 7010 and 7008. Based on FIG. 28, the lattice matched composition of $In_xGa_{1-x}As$ is about 1%, the minimum composition is about 0.7%, and the maximum composition is 1.4%. Also shown in FIG. 28 are the lattice constant of AlAs at 7002 and of GaAs at 7006.

It should be noted also that the values in FIGS. 26, 27, and 28 are for the lattice constant at room temperature, and that the material will have different lattice at different temperatures such as the growth temperature for example. Therefore the composition values used for the ternary allow can be adjusted for the coefficient of thermal expansion values of these materials, to take into account the lattice constant at temperatures other than room temperature depending on optimization strategies which can be based on performance data or material parameters. Also one skilled in the art would realize that other ternary or quaternary alloys or with even more elements, can be possible, notably the alloys incorporating some fraction of nitrogen.

FIGS. 26, 27, and 28 show upper boundaries 7008 and lower boundaries 7010 having the same values. As mentioned above the exact value of the boundaries (tolerances) need to be established based by process optimization, material parameter modeling, or performance optimization. Also the minimum boundaries need not to be symmetric with the maximum boundaries. For example some material might be more tolerant to compressive strain than to tensile stress, or vice-versa. Post-growth X-ray crystal diffraction analysis tools allow measuring the residual strain which can be expressed in arc sec or in part-per-million (ppm) in reference to the X-ray diffraction peaks of the strain layer vs the peaks from the substrate. Such measurements, possibly also combined with morphology analysis like surface scan mapping or Nomarski microscope inspection, can be used to determine if excessive strain has been accumulated and correlated with the device performance to better optimize the acceptable minimum and maximum tolerance for the different materials of interest. Furthermore, the epitaxy equipment use to grow the epiwafers can be preferably equipped with in-situ wafer curvature measurement techniques to directly evaluate the residual strain in the various epilayers and therefore adjust the above composition tolerance accordingly and individually for the different semiconductor alloys.

The present invention provides a method for fabricating electronic or opto-electronic devices having a group IV substrate on which a III/V layer structure is deposited. The method allows for the manufacturing of devices with improved morphology and controlled doping profiles of group V constituents into the group IV substrate and group IV constituents into the III/V layers. Devices fabricated according to the present invention have very good reverse breakdown voltage characteristics as well as excellent forward bias characteristics, in addition to a smooth morphology which is ideal for the epitaxy of additional active layers above the p/n junction produced or not during the nucleation sequence.

The present disclosure allows for the manufacturing of devices with improved morphology and controlled doping profiles. The anti-phase domain defects have been greatly reduced with the present disclosure. As mentioned above, the reason for this improvement fundamentally relates to the ability to cover the group IV layer with a nucleation layer (that can include a sequence of group III atoms and group V atoms (e.g., a layer of AlAs)) that sets the order of the group III and the group V elements in a well-defined pattern over areas of the growth surface. This can be achieved even with a nucleation layer having an average thickness less than one monolayer.

The benefits of the present disclosure are particularly relevant for devices for which the performance is higher when a lower density of defects is present. This includes lattice-matched or quasi-lattice matched heterostructures. As opposed to heterostructures based on metamorphic layers, the lattice-matched or quasi-lattice matched heterostructures will have a very low level of defects and therefore a nucleation method as described in the present disclosure, which minimizes the anti-phase boundary defects, will be particularly beneficial in that case to achieve and maintain high device performance. Epitaxial layers that do not have strain-induced defects are often called pseudomorphic layers. Pseudomorphic heterostructures can contain strained layers but only to the extent that elastic deformations are able to accommodate that strain such that no defects are generated by excess stresses or strains in the device. High quality pseudomorphic devices obviously require a nucleation method capable of producing a minimum defect density. Furthermore, as opposed to homostructures, in semiconductor heterostructures containing with dissimilar material such as III-V devices grown on group IV substrates, it is also important to control the diffusion of the group IV layers toward to III-V layers, and vice versa. The lower defect density in pseudomorphic heterostructure devices is preferable in order to have less dopant diffusion between the various layers, to have less alloy diffusion, to increase the device yield over the wafer surface, to increase the device reliability over time since defects typically have a lower activation energy where metal-semiconductor can interdiffuse and interact, especially in areas where metallization is necessary for the device functionality.

The above-described embodiments of the present invention are intended to be examples only. Those of skill in the art may effect alterations, modifications and variations to the particular embodiments without departing from the scope of the invention, which is defined solely by the claims appended hereto.

What is claimed is:

1. A multi-junction solar cell comprising:
a group IV layer having a surface defined by a (100), (010) or (001) plane inclined, at an angle ranging from 0° to 20°, towards a (111) plane of the group IV layer, the (100), (010) or (001) plane containing group IV elements spaced-apart by an in-plane lattice parameter of the group IV layer;
a nucleation layer formed on the surface of the group IV layer, the nucleation layer including a III-V compound having at least aluminum (Al) as a group III element and at least one of arsenic (As), nitrogen (N) and antimony (Sb) as a group V element; and
at least one additional layer containing a III-V compound, the at least one additional layer being formed on the nucleation layer, the at least one additional layer and the nucleation layer each having, in a direction substantially parallel to the (100), (010) or (001) plane, a lattice parameter substantially equal to the in-plane lattice parameter of the group IV layer, the solar cell including a first p-n junction formed in the group IV layer and a second p-n junction formed in the at least one additional layer.

2. The solar cell of claim 1 wherein the group IV layer and the nucleation layer are in an arrangement defined by having substantially only group III elements of the nucleation layer positioned on the surface of the group IV layer to form a group III monolayer, the arrangement further defined by having substantially only group V elements of the nucleation layer positioned on the group III monolayer, the arrangement to prevent a formation of anti-phase domain defects in the first III-V compound layer, to control a diffusion of group V elements from the first III-V compound layer into the group IV layer, and to control a diffusion of group IV elements from the group IV layer into the first III-V compound layer.

3. The solar cell of claim 1 wherein, the group IV layer and the nucleation layer are in an arrangement defined by having substantially only group V elements of the nucleation layer positioned on the surface of the group IV layer to form a group V monolayer, the arrangement further defined by having substantially only group III elements of the nucleation layer positioned on the group V monolayer, the arrangement to prevent a formation of anti-phase domain defects in the first III-V compound layer, to control a diffusion of group V elements from the first III-V compound layer into the group IV layer, and to control a diffusion of group IV elements from the group IV layer into the first III-V compound layer.

4. The solar cell of claim 1 wherein the nucleation layer covers at least 25% of the surface of the group IV layer.

5. The solar cell of claim 1 wherein at least one of the nucleation layer and the at least one additional layer is a pseudomorphic layer.

6. The solar cell of claim 1 wherein the nucleation layer is a strained layer.

7. The solar cell of claim 1 wherein the nucleation layer further includes at least one of gallium (Ga) and indium (In) as a group III element.

8. The solar cell of claim 1 wherein the at least one additional layer includes at least one of GaInP, AlInP, and AlGaInP.

9. The solar cell of claim 1 wherein the at least one additional layer includes an InGaAs layer.

10. The solar cell of claim 1 wherein the group IV layer is one of a p-type layer, an n-type layer and an undoped layer.

11. The solar cell of claim 1 wherein the group IV layer is selected from the group consisting of a Ge layer, a Si layer, a SiGe and a SiC layer.

12. The solar cell of claim 1 wherein the group IV layer is a group IV substrate.

13. The solar cell of claim 1 wherein at least one of the nucleation layer and the at least one additional layer is formed by an epitaxial growth process.

14. The solar cell of claim 1 wherein an average thickness of the nucleation layer is at least 0.25 monolayer.

15. A multi-junction solar cell comprising:
    a group IV layer having a surface defined by a (100), (010) or (001) plane inclined, at an angle ranging from 0° to 20°, towards a (111) plane of the group IV layer, the (100), (010) or (001) plane containing group IV elements spaced-apart by an in-plane lattice parameter of the group IV layer;
    a nucleation layer formed on the surface of the group IV layer, the nucleation layer including a III-V compound, a thickness of the nucleation being comprised between 0.25 monolayer of the III-V compound and one monolayer of the III-V compound; and
    at least one additional layer containing a III-V compound, the at least one additional layer being formed on the nucleation layer, the at least one additional layer and the nucleation layer each having, in a direction substantially parallel to the (100), (010) or (001) plane, a lattice parameter substantially equal to the in-plane lattice parameter of the group IV layer, the solar cell including a first p-n junction formed in the group IV layer and a second p-n junction formed in the at least one additional layer.

16. The solar cell of claim 15 wherein the nucleation has at least aluminum (Al) as a group III element and at least one of arsenic (As), nitrogen (N) and antimony (Sb) as a group V element.

17. A multi-junction solar cell comprising:
    a group IV layer having a surface defined by a plane, the plane containing group IV elements spaced-apart by an in-plane lattice parameter of the group IV layer, the group IV layer having a p-n junction formed therein;
    a nucleation layer formed on the surface of the group IV layer, the nucleation layer having a thickness, the nucleation layer including a III-V compound having at least aluminum (Al) as a group III element and at least one of arsenic (As), nitrogen (N) and antimony (Sb) as a group V element; and
    at least one additional layer containing a III-V compound, the at least one additional layer being formed on the nucleation layer, the at least one additional layer having, in a direction substantially parallel to the plane of the group IV layer, a lattice parameter substantially equal to the in-plane lattice parameter of the group IV layer, the p-n junction having a p-doped base and an n-doped emitter, the n-doped emitter being defined by at least two n-type dopants, each n-type dopant having associated thereto a respective concentration that varies as a function of distance from the group IV surface, one of the n-type dopants being a group V element, from the at least one additional layer, that has diffused from the at least one additional layer into the group IV layer, another of the n-type dopants being a group V element, from the nucleation layer, that has diffused from the nucleation layer into the group IV layer.

18. The solar cell of claim 17 wherein each concentration associated with each of the n-type dopant is a function of the thickness.

19. The solar cell of claim 17 wherein the plane of the group IV layer is a (100), (010) or (001) plane inclined, at an angle ranging from 0° to 20°, towards a (111) plane of the group IV layer.

* * * * *